(12) United States Patent
Bunyk

(10) Patent No.: US 9,178,154 B2
(45) Date of Patent: Nov. 3, 2015

(54) QUANTUM PROCESSOR COMPRISING A SECOND SET OF INTER-CELL COUPLING DEVICES WHERE A RESPECTIVE PAIR OF QUBITS IN PROXIMITY ADJACENT UNIT CELLS CROSSED ONE ANOTHER

(71) Applicant: D-Wave Systems Inc., Burnaby (CA)

(72) Inventor: Paul Bunyk, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 68 days.

(21) Appl. No.: 14/050,062

(22) Filed: Oct. 9, 2013

(65) Prior Publication Data

US 2014/0097405 A1     Apr. 10, 2014

Related U.S. Application Data

(60) Provisional application No. 61/711,647, filed on Oct. 9, 2012.

(51) Int. Cl.
    *H01L 49/00*    (2006.01)
    *H01L 39/22*    (2006.01)
    *H01L 31/0352*  (2006.01)
    (Continued)

(52) U.S. Cl.
    CPC .............. *H01L 49/006* (2013.01); *B82Y 10/00* (2013.01); *G06N 99/002* (2013.01); *H01L 31/035209* (2013.01); *H01L 31/035218* (2013.01); *H01L 39/22* (2013.01)

(58) Field of Classification Search
    CPC ...... B82Y 10/00; G11C 11/44; H01L 39/006; H01L 39/22; H01L 31/035209; H01L 31/035218

USPC ............................. 257/31, E39.014; 505/190
    See application file for complete search history.

(56) References Cited

U.S. PATENT DOCUMENTS

| 7,135,701 | B2 | 11/2006 | Amin et al. |
| 7,418,283 | B2 | 8/2008 | Amin |
| 7,533,068 | B2 | 5/2009 | Maassen van den Brink et al. |

(Continued)

FOREIGN PATENT DOCUMENTS

WO     2012/064974 A2     5/2012

OTHER PUBLICATIONS

Bocko et al., "Prospects for Quantum Coherent Computation Using Superconducting Electronics," *IEEE Transactions on Applied Superconductivity* 7(2):3638-3641, 1997.

(Continued)

*Primary Examiner* — Anh Mai
(74) *Attorney, Agent, or Firm* — Seed IP Law Group PLLC

(57) ABSTRACT

Quantum processor architectures employ unit cells tiled over an area. A unit cell may include first and second sets of qubits where each qubit in the first set crosses at least one qubit in the second set. Each unit cell is positioned proximally adjacent at least one other unit cell. Within each unit cell, at least one qubit is longitudinally shifted with respect to at least one other qubit such that the longitudinally-shifted qubit crosses at least one qubit in a proximally adjacent unit cell. Communicative coupling between qubits is realized through respective intra-cell and inter-cell coupling devices. The longitudinal shifting of qubits and resultant crossing of qubits in proximally adjacent unit cells enables quantum processor architectures that can be better suited to solve certain problems.

28 Claims, 7 Drawing Sheets

(51) Int. Cl.
  *G06N 99/00* (2010.01)
  *B82Y 10/00* (2011.01)

(56) References Cited

U.S. PATENT DOCUMENTS

| | | | |
|---|---|---|---|
| 7,619,437 | B2 | 11/2009 | Thom et al. |
| 7,843,209 | B2 | 11/2010 | Berkley |
| 7,876,248 | B2 | 1/2011 | Berkley et al. |
| 7,898,282 | B2 | 3/2011 | Harris et al. |
| 7,969,805 | B2 | 6/2011 | Thom et al. |
| 8,008,942 | B2 | 8/2011 | van den Brink et al. |
| 8,018,244 | B2 | 9/2011 | Berkley |
| 8,035,540 | B2 | 10/2011 | Berkley et al. |
| 8,098,179 | B2 | 1/2012 | Bunyk et al. |
| 8,169,231 | B2 | 5/2012 | Berkley |
| 8,190,548 | B2 | 5/2012 | Choi |
| 8,195,596 | B2 | 6/2012 | Rose et al. |
| 8,421,053 | B2 | 4/2013 | Bunyk et al. |
| 8,772,759 | B2 * | 7/2014 | Bunyk et al. ........... 257/31 |
| 2012/0094838 | A1 | 4/2012 | Bunyk et al. |
| 2014/0223224 | A1 * | 8/2014 | Berkley ................... 714/10 |
| 2014/0229722 | A1 * | 8/2014 | Harris .......................... 713/1 |
| 2015/0032991 | A1 * | 1/2015 | Lanting et al. ............ 712/30 |
| 2015/0046681 | A1 * | 2/2015 | King .......................... 712/42 |

OTHER PUBLICATIONS

Clarke et al., "Superconducting Quantum Bits," *Nature* 453:1031-1042, Jun. 19, 2008.
Devoret, M.H. et al., "Superconducting Qubits: A Short Review," arXiv:cond-mat/0411174v1 [cond-mat.mes-hall], pp. 1-41, Nov. 7, 2004.
Devoret, M.H. et al., "Superconducting Circuits for Quantum Information: An Outlook," *Science* 339:1169-1174, 2013.
Friedman et al., "Quantum superposition of distinct macroscopic states," *Nature* 406:43-46, Jul. 6, 2000.
Harris, R. et al., "Experimental Demonstration of a Robust and Scalable Flux Qubit," *Physical Review B 81*, 134510, arXiv:0909.4321v1, pp. 1-20, 2010.
Makhlin et al., "Quantum-State Engineering with Josephson-Junction Devices," *Reviews of Modern Physics* 73(2):357-400, Apr. 2001.
Martinis, J., "Superconducting Phase Qubits," *Quantum Information Processing* 8(81), 22 pages, 2009.
Mooij et al., "Josephson Persistent-Current Qubit," *Science* 285:1036-1039, Aug. 13, 1999.
Orlando et al., "Superconducting Persistent-Current Qubit," *Physical Review B* 60(22):15 398-15 413, Dec. 1, 1999.
Zagoskin, A. et al., "Superconducting Qubits," *La Physique Au Canada* 63(4):215-227, 2007.

\* cited by examiner

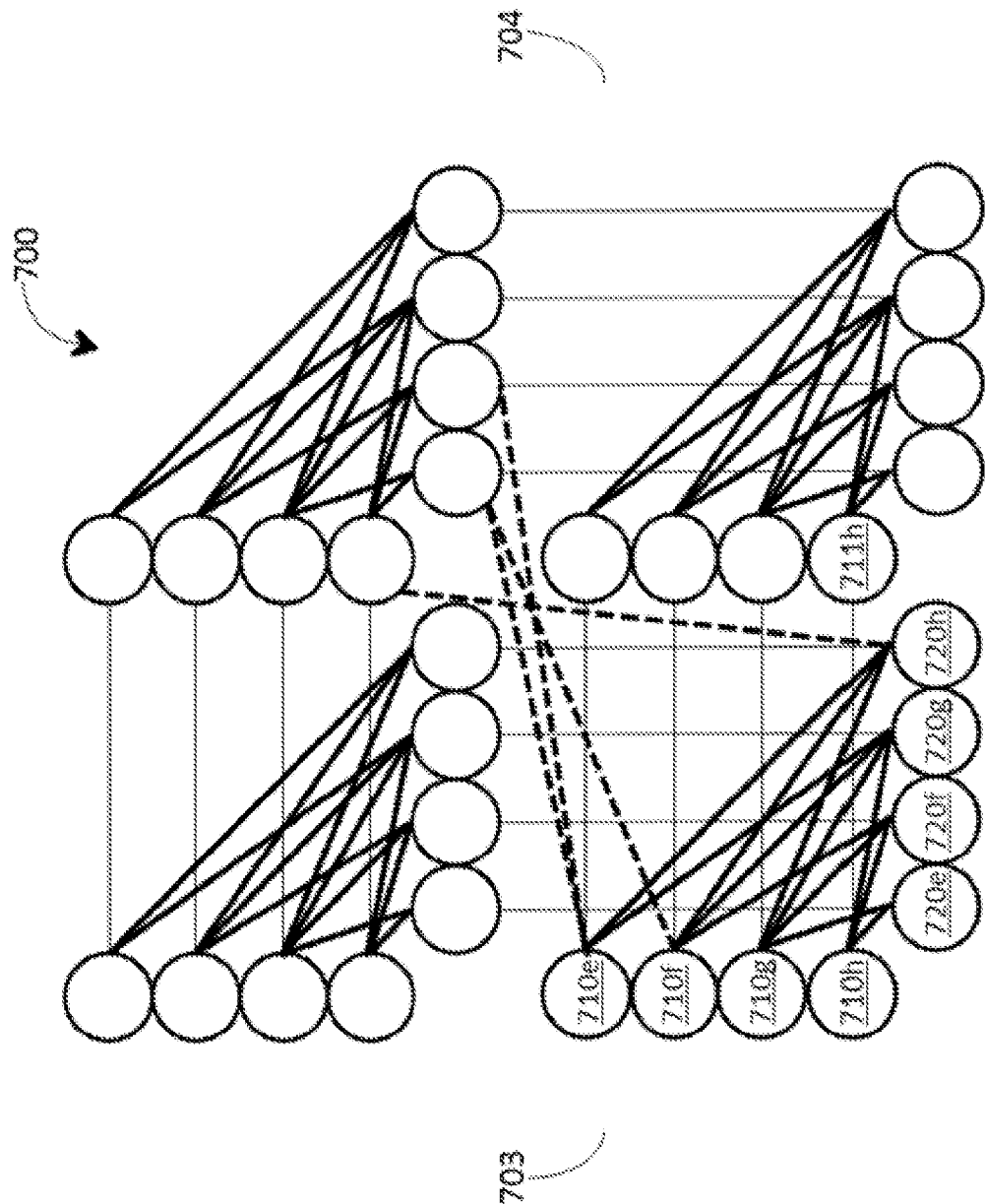

QUANTUM PROCESSOR COMPRISING A SECOND SET OF INTER-CELL COUPLING DEVICES WHERE A RESPECTIVE PAIR OF QUBITS IN PROXIMITY ADJACENT UNIT CELLS CROSSED ONE ANOTHER

BACKGROUND

Field

This disclosure generally relates to designs, layouts, and architectures for quantum processors comprising qubits.

Adiabatic Quantum Computation

Adiabatic quantum computation typically involves evolving a system from a known initial Hamiltonian (the Hamiltonian being an operator whose eigenvalues are the allowed energies of the system) to a final Hamiltonian by gradually changing the Hamiltonian. A simple example of an adiabatic evolution is given by:

$$H_e = (1-s)H_i + sH_f$$

where $H_i$ is the initial Hamiltonian, $H_f$ is the final Hamiltonian, $H_e$ is the evolution or instantaneous Hamiltonian, and s is an evolution coefficient which controls the rate of evolution. As the system evolves, the evolution coefficient s goes from 0 to 1 such that at the beginning (i.e., s=0) the evolution Hamiltonian $H_e$ is equal to the initial Hamiltonian $H_i$ and at the end (i.e., s=1) the evolution Hamiltonian $H_e$ is equal to the final Hamiltonian $H_f$. Before the evolution begins, the system is typically initialized in a ground state of the initial Hamiltonian $H_i$ and the goal is to evolve the system in such a way that the system ends up in a ground state of the final Hamiltonian $H_f$ at the end of the evolution. If the evolution is too fast, then the system can be excited to a higher energy state, such as the first excited state. In the present systems and devices, an "adiabatic" evolution is considered to be an evolution that satisfies the adiabatic condition:

$$\dot{s}|\langle 1|dH_e/ds|0\rangle| = \delta g^2(s)$$

where $\dot{s}$ is the time derivative of s, g(s) is the difference in energy between the ground state and first excited state of the system (also referred to herein as the "gap size") as a function of s, and δ is a coefficient much less than 1. Generally the initial Hamiltonian $H_i$ and the final Hamiltonian $H_f$ do not commute; that is, $[H_i, H_f] \neq 0$.

The evolution process in adiabatic quantum computing may sometimes be referred to as annealing. The rate that s changes, sometimes referred to as an evolution or annealing schedule, is normally slow enough that the system is always in the instantaneous ground state of the evolution Hamiltonian during the evolution, and transitions at anti-crossings (i.e., when the gap size is smallest) are avoided. Further details on adiabatic quantum computing systems, methods, and apparatus are described in, for example, U.S. Pat. No. 7,135,701 and U.S. Pat. No. 7,418,283.

Quantum Annealing

Quantum annealing is a computation method that may be used to find a low-energy state, typically preferably the ground state, of a system. Somewhat similar in concept to classical annealing, the method relies on the underlying principle that natural systems tend towards lower energy states because lower energy states are more stable. However, while classical annealing uses classical thermal fluctuations to guide a system to its global energy minimum, quantum annealing may use quantum effects, such as quantum tunneling, to reach a global energy minimum more accurately and/or more quickly than classical annealing. It is known that the solution to a hard problem, such as a combinatorial optimization problem, may be encoded in the ground state of a system Hamiltonian (e.g., the Hamiltonian of an Ising spin glass) and therefore quantum annealing may be used to find the solution to such a hard problem. Adiabatic quantum computation may be considered a special case of quantum annealing for which the system, ideally, begins and remains in its ground state throughout an adiabatic evolution. Thus, those of skill in the art will appreciate that quantum annealing systems and methods may generally be implemented on an adiabatic quantum computer. Throughout this specification and the appended claims, any reference to quantum annealing is intended to encompass adiabatic quantum computation unless the context requires otherwise.

Quantum annealing uses quantum mechanics as a source of disorder during the annealing process. The optimization problem is encoded in a Hamiltonian $H_P$, and the algorithm introduces strong quantum fluctuations by adding a disordering Hamiltonian $H_D$ that does not commute with $H_P$. An example case is:

$$H_E \propto A(t)H_D + B(t)H_P,$$

where A(t) and B(t) are time dependent envelope functions. For example, A(t) changes from a large value to substantially zero during the evolution and $H_E$ may be thought of as an evolution Hamiltonian similar to $H_e$ described in the context of adiabatic quantum computation above. The disorder is slowly removed by removing $H_D$ (i.e., reducing A(t)). Thus, quantum annealing is similar to adiabatic quantum computation in that the system starts with an initial Hamiltonian and evolves through an evolution Hamiltonian to a final "problem" Hamiltonian $H_P$ whose ground state encodes a solution to the problem. If the evolution is slow enough, the system will typically settle in the global minimum (i.e., the exact solution), or in a local minimum close in energy to the exact solution. The performance of the computation may be assessed via the residual energy (difference from exact solution using the objective function) versus evolution time. The computation time is the time required to generate a residual energy below some acceptable threshold value. In quantum annealing, Hp may encode an optimization problem and therefore $H_P$ may be diagonal in the subspace of the qubits that encode the solution, but the system does not necessarily stay in the ground state at all times. The energy landscape of $H_P$ may be crafted so that its global minimum is the answer to the problem to be solved, and low-lying local minima are good approximations.

The gradual reduction of disordering Hamiltonian $H_D$ (i.e., reducing A(t) in quantum annealing may follow a defined schedule known as an annealing schedule. Unlike adiabatic quantum computation where the system begins and remains in its ground state throughout the evolution, in quantum annealing the system may not remain in its ground state throughout the entire annealing schedule. As such, quantum annealing may be implemented as a heuristic technique, where low-energy states with energy near that of the ground state may provide approximate solutions to the problem. The removal of the disordering Hamiltonian $H_D$ may occur after the same Hamiltonian has been added. That, is turn the disordering Hamiltonian $H_D$ ON and then OFF.

Quantum Processor

A quantum processor may take the form of a superconducting quantum processor. A superconducting quantum processor may include a number of qubits and associated local bias devices, for instance two or more superconducting qubits. A superconducting quantum processor may also employ coupling devices (i.e., "couplers") providing communicative coupling between qubits. A qubit and a coupler resemble each other but differ in physical parameters. One difference is the parameter, $\beta$. Consider an rf-SQUID, superconducting loop interrupted by a Josephson junction where $\beta$ is the ratio of the inductance of a Josephson junction to the geometrical inductance of the loop. A design with lower values of $\beta$, about 1, behaves more like a simple inductive loop, a monostable device. A design with higher values is more dominated by the Josephson junctions and is more likely to have bistable behavior. $\beta$ is defined as $2\pi L I_C/\Phi_0$ where L is the inductance of the loop, $\beta$ is the critical current of the qubit/coupler and $\Phi_0$ is the flux quantum. That is, $\beta$ is the product of inductance and critical current. One can vary the inductance, for example, a qubit is normally larger than its associated coupler. The larger device has a larger inductance and thus a qubit is often a bistable device and a coupler monostable. Alternatively the critical current can be varied or the product of the critical current and inductance can be varied. A qubit often will have more devices associated with it. Further details and embodiments of exemplary quantum processors that may be used in conjunction with the present systems and devices are described in, for example, U.S. Pat. No. 7,533,068, U.S. Pat. No. 8,008,942, US Patent Publication 2008-0176750 (now U.S. Pat. No. 8,195,596), US Patent Publication 2009-0121215 (now U.S. Pat. No. 8,190,548), and US Patent Publication 2011-0022820 (now U.S. Pat. No. 8,421,053).

The types of problems that may be solved by any particular embodiment of a quantum processor, as well as the relative size and complexity of such problems, typically depend on many factors. Two such factors may include the number of qubits in the quantum processor and the connectivity (i.e., the availability of communicative couplings) between the qubits in the quantum processor. Throughout this specification, the term "connectivity" is used to describe the maximum number of possible communicative coupling paths that are physically available (e.g., whether active or not) to communicably couple between individual qubits in a quantum processor without the use of intervening qubits. For example, a qubit with a connectivity of three is capable of directly communicably coupling to up to three other qubits without any intervening qubits. In other words, there are direct communicative coupling paths available to three other qubits, although in any particular application all or less than all of those communicative coupling paths may be employed. Typically, the number of qubits in a quantum processor limits the size of problems that may be solved and the interaction between the qubits in a quantum processor limits the complexity of the problems that may be solved.

US Patent Publication 2011-0022820 describes a quantum processor with qubits laid out into an architecture such that each qubit may communicatively couple to at least five other qubits and a connectivity of six may be achieved. Depending on the available number of qubits and their interaction, problems of various sizes may be embedded into the quantum processor.

BRIEF SUMMARY

The fixed architecture described in US Patent Publication 2011-0022820 is strongly coupled to qubits within each unit cell. However, it has limited interaction between unit cells. Therefore, it may very well be able solve a certain set of problems while some other problems may benefit from altering the architecture of the qubits laid out on the quantum processor such that different qubit interconnections may be realized between adjacent unit cells. Therefore, there is growing need for new quantum processor architectures to better embed certain problem instances that may otherwise be difficult to solve using the existing architecture.

A quantum processor may be summarized as including a plurality of unit cells tiled over an area such that each unit cell is positioned proximally adjacent at least one other unit cell, each unit cell comprising: a first set of qubits and a second set of qubits, wherein a portion of each qubit in the first set of qubits crosses a portion of at least one qubit in the second set of qubits; and a set of intra-cell coupling devices, wherein each intra-cell coupling device is positioned proximate a respective point where one of the qubits in the first set of qubits crosses one of the qubits in the second set of qubits and provides controllable communicative coupling between the one of the qubits in the first set of qubits and the one of the qubits in the second set of qubits; wherein a portion of at least one qubit in the first set of qubits in each unit cell crosses a portion of at least one qubit in the second set of qubits in at least one proximally adjacent unit cell, and wherein the quantum processor further comprises: a first set of inter-cell coupling devices, wherein each inter-cell coupling device in the first set of inter-cell coupling devices provides controllable communicative coupling between either a respective pair of qubits each in a respective first set of qubits in a respective one of a pair of proximally adjacent unit cells or a respective pair of qubits each in a respective second set of qubits in a respective one of a pair of proximally adjacent unit cells; and a second set of inter-cell coupling devices, wherein each inter-cell coupling device in the second set of inter-cell coupling devices is proximate a respective point where a respective pair of qubits in proximally adjacent unit cells cross one another and provides controllable communicative coupling between the respective pair of qubits in proximally adjacent unit cells that cross one another. The quantum processor may include a multi-layered integrated circuit. The quantum processor may include a superconducting quantum processor and the multi-layered integrated circuit may include a multi-layered superconducting integrated circuit. Each qubit may include a loop of superconducting material interrupted by at least one Josephson junction. Each coupling device may include a loop of superconducting material interrupted by at least one Josephson junction.

In each unit cell, each loop of superconducting material may be elongated along a respective longitudinal axis, wherein the respective longitudinal axis of each qubit in the first set of qubits may be parallel to the respective longitudinal axis of each of the other qubits in the first set of qubits and the respective longitudinal axis of each qubit in the second set of qubits may be parallel to the respective longitudinal axis of each of the other qubits in the second set of qubits. Furthermore, in each unit cell, the respective longitudinal axis of each qubit in the first set of qubits may be perpendicular to the respective longitudinal axis of each qubit in the second set of qubits such that a portion of each qubit in the first set of qubits perpendicularly crosses a portion of at least one qubit in the second set of qubits.

In each unit cell, the first set of qubits may include at least four qubits and the second set of qubits may include at least four qubits, such that each unit cell may include at least eight qubits. Each unit cell may be positioned horizontally proximally adjacent, vertically proximally adjacent, or diagonally proximally adjacent at least one other unit cell. For example, each unit cell may be positioned proximally adjacent at least three other unit cells such that each unit cell is positioned horizontally proximally adjacent at least one other unit cell, vertically proximally adjacent at least one other cell, and diagonally proximally adjacent at least one other cell.

In each unit cell, at least a portion of each qubit in the first set of qubits may be carried in a first layer and at least a portion of each qubit in the second set of qubits may be carried in a second layer, such that at each respective point where one of the qubits in the first set of qubits crosses one of the qubits in the second set of qubits, the one of the qubits in the first set of qubits may be in the first layer and the one of the qubits in the second set of qubits may be in the second layer, the second layer different from the first layer. Furthermore, in each unit cell, at least a portion of each intra-cell coupling device and/or at least a portion of each inter-cell coupling device from the first set of inter-cell coupling devices and/or at least a portion of each inter-cell coupling device from the second set of inter-cell coupling devices may be carried in the second layer. In each unit cell, at least a portion of each intra-cell coupling device and/or at least a portion of each inter-cell coupling device from the first set of inter-cell coupling devices and/or at least a portion of each inter-cell coupling device from the second set of inter-cell coupling devices may be carried in a third layer. In each unit cell, at least a portion of each qubit in the first set of qubits may be carried in the second layer and/or at least a portion of each qubit in the second set of qubits may be carried in the first layer.

A quantum processor may be summarized as including a plurality of unit cells tiled over an area such that each unit cell is positioned proximally adjacent at least one other unit cell, each unit cell comprising: a plurality of qubits, wherein each qubit in the plurality of qubits respectively comprises: a loop of superconducting material that is elongated along a longitudinal axis; and a first end where the loop crosses the longitudinal axis; wherein the plurality of qubits includes a first set of qubits and a second set of qubits, the qubits in the second set being different from the qubits in the first set, the respective longitudinal axes of the qubits in the first set parallel to a first direction and the respective longitudinal axes of the qubits in the second set parallel to a second direction, the first direction and the second direction being at a non-zero angle to one another, a portion of each qubit in the first set of qubits crosses a portion of at least one qubit in the second set of qubits, and wherein at least one qubit in the first set of qubits is longitudinally shifted with respect to at least one other qubit in the first set of qubits such that a transverse axis of the at least one longitudinally-shifted qubit, perpendicular to the longitudinal axis of the at least one longitudinally-shifted qubit, that passes through the first end of the at least one longitudinally-shifted qubit does not pass through the first end of the at least one other qubit in the first set of qubits; and a set of intra-cell coupling devices, wherein each intra-cell coupling device is positioned proximate a respective point where one of the qubits in the first set of qubits crosses one of the qubits in the second set of qubits and provides controllable communicative coupling between the one of the qubits in the first set of qubits and the one of the qubits in the second set of qubits; wherein a portion of the at least one longitudinally-shifted qubit in the first set of qubits in each unit cell crosses a portion of at least one qubit in the second set of qubits in at least one proximally adjacent unit cell, and wherein the quantum processor further comprises: a plurality of inter-cell coupling devices, the plurality of inter-cell coupling devices including: a first set of inter-cell coupling devices, wherein each inter-cell coupling device in the first set of inter-cell coupling devices provides controllable communicative coupling between a respective pair of qubits having parallel longitudinal axes in proximally adjacent unit cells; and a second set of inter-cell coupling devices, wherein each inter-cell coupling device in the second set of inter-cell coupling devices is positioned proximate a respective point where the at least one longitudinally-shifted qubit in the first set of qubits in each unit cell crosses one of the qubits in the second set of qubits in a proximally adjacent unit cell and provides controllable communicative coupling between the at least one longitudinally-shifted qubit in the first set of qubits and the one of the qubits in the second set of qubits in the proximally adjacent unit cell. In each unit cell, the non-zero angle between the first direction and the second direction may be about ninety degrees such that the respective longitudinal axes of the qubits in the first set of qubits is perpendicular to the respective longitudinal axes of the qubits in the second set of qubits.

The respective superconducting loop of each qubit may be interrupted by at least one respective Josephson junction. Each coupling device may include a respective loop of superconducting material interrupted by at least one Josephson junction. A portion of at least one qubit in at least one unit cell may cross both a portion of at least one qubit in a first proximally adjacent unit cell and a portion of at least one qubit in a second proximally adjacent unit cell. The quantum processor may include a multi-layered superconducting integrated circuit, and, in each unit cell, at least a portion of each qubit in the first set of qubits may be carried in a first layer and at least a portion of each qubit in the second set of qubits may be carried in a second layer, such that at each respective point where one of the qubits in the first set of qubits crosses one of the qubits in the second set of qubits, the one of the qubits in the first set of qubits is in the first layer and the one of the qubits in the second set of qubits is in the second layer, the second layer different from the first layer.

In each unit cell, at least a portion of each intra-cell coupling device and/or at least a portion of each inter-cell coupling device from the first set of inter-cell coupling devices and/or at least a portion of each inter-cell coupling device from the second set of inter-cell coupling devices may be carried in the second layer. In each unit cell, at least a portion of each intra-cell coupling device and/or at least a portion of each inter-cell coupling device from the first set of inter-cell coupling devices and/or at least a portion of each inter-cell coupling device from the second set of inter-cell coupling devices may be carried in a third layer. In each unit cell, at least a portion of each qubit in the first set of qubits may be carried in the second layer and/or at least a portion of each qubit in the second set of qubits may be carried in the first layer.

Each unit cell may be positioned horizontally proximally adjacent, vertically proximally adjacent, or diagonally proximally adjacent at least one other unit cell. For example, each unit cell may be positioned proximally adjacent at least three other unit cells such that each unit cell is positioned horizontally proximally adjacent at least one other unit cell, vertically proximally adjacent at least one other cell, and diagonally proximally adjacent at least one other unit cell.

At least one pair of qubits having parallel longitudinal axes in proximally adjacent unit cells may include a first qubit and a second qubit, the first qubit being in the first set of qubits in a first unit cell and the second qubit being in the first set of qubits in a second unit cell, wherein the second unit cell is proximally adjacent the first unit cell. In each unit cell, the first set of qubits may include at least four qubits and the second set of qubits may include at least four qubits, such that each unit cell may include at least eight qubits. Each qubit in the plurality of qubits may include a second end where the loop crosses the longitudinal axis, the second end distal to the first end; and a midpoint positioned on the longitudinal axis at least approximately halfway between the first end and the second end; and the at least one longitudinally-shifted qubit in the first set of qubits may be longitudinally shifted with respect to the at least one other qubit in the first set of qubits such that the transverse axis of the at least one longitudinally-shifted qubit that passes through the first end of the at least one longitudinally-shifted qubit passes through the midpoint of the at least one other qubit.

A quantum processor may be summarized as including a plurality of unit cells tiled over an area such that each unit cell is positioned proximally adjacent at least one other unit cell, each unit cell comprising: a first set of qubits and a second set of qubits, a portion of at least one qubit in one of the first or the second sets of qubits overlies a portion of at least one qubit in the other one of the first or the second sets of qubits; and a set of intra-cell coupling devices, wherein each intra-cell coupling device is proximate a respective point where one of the qubits in the one of the first or the second set of qubits overlies one of the qubits in the other one of the first or the second set of qubits and provides controllable communicative coupling between the respective one of the qubits in the first and the second sets of qubits; wherein a portion of at least one qubit in the one of the first or the second sets of qubits in each unit cell overlies a portion of at least one qubit in the other one of the first or second set of qubits in at least one proximally adjacent unit cell, and wherein the quantum processor further includes: a first set of inter-cell coupling devices, wherein each inter-cell coupling device in the first set of inter-cell coupling devices provides controllable communicative coupling between either a respective pair of qubits each in a respective first set of qubits in a respective one of a pair of proximally adjacent unit cells or a respective pair of qubits each in a respective second set of qubits in a respective one of a pair of proximally adjacent unit cells; and a second set of inter-cell coupling devices, wherein each inter-cell coupling device in the second set of inter-cell coupling devices is proximate a respective point where a respective pair of qubits in proximally adjacent unit cells respectively overlie and underlie one another and provides controllable communicative coupling between the respective pair of qubits in proximally adjacent unit cells that respectively overlie and underlie one another.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIG. 7 is a graph illustrating the interconnections realized between the qubits in the quantum processor architecture shown in FIG. 6, in accordance with the present systems and devices.

DETAILED DESCRIPTION OF THE INVENTION

Figure 1:
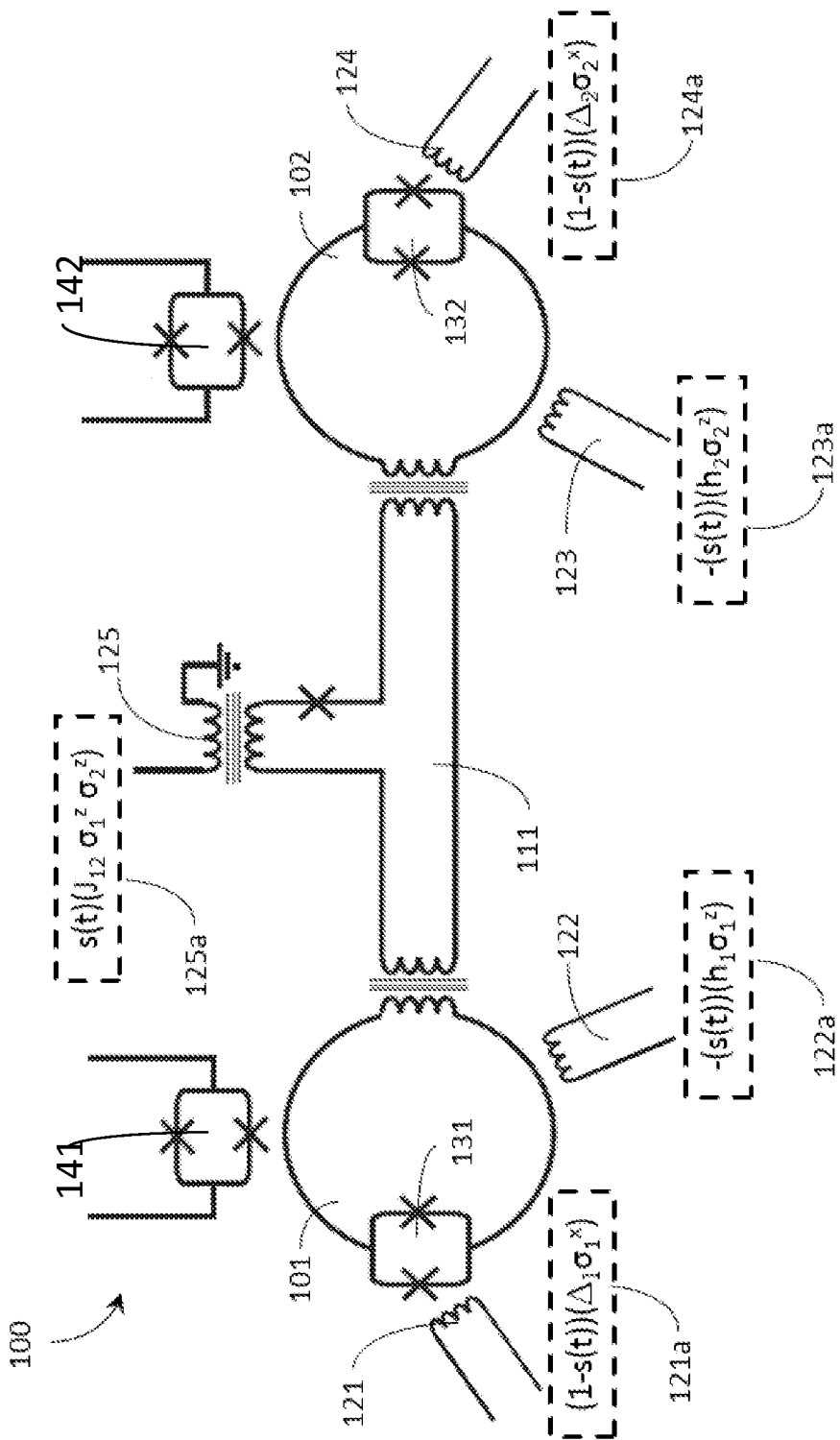
FIG. 1 is a schematic diagram of a portion of an exemplary superconducting quantum processor designed for AQC (and/or quantum annealing) that may be used to implement the present systems and devices.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with quantum processors, qubits, couplers, controller, readout devices and/or interfaces have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The various embodiments described herein provide systems and devices for quantum processor architectures that advantageously facilitate mapping and/or embedding for some problems/applications with more inter-cell qubit interconnections. For example, the present systems and devices include quantum processor architectures employing qubit interconnections that may be designed to suit the problem to be embedded into the quantum processor by altering the quantum processor architecture that may otherwise be difficult to solve via a fixed architecture such as the fixed architecture described in for example, US Patent Publication 2011-0022820. Throughout this specification and the appended claims, the "architecture" of a quantum processor is defined by the relative physical positions of the qubits and coupling devices ("couplers") in the quantum processor. Any given coupling device may be ON/OFF depending on the programming configuration of the quantum processor. Which couplings are ON/OFF is a configuration of the quantum processor. ON can have various values ranging from FerroMagnetic (FM) or AntiFerroMagnetic (AFM) with a number of intervening levels. The number of levels is conventionally set by the precision of the control system for the coupler. Conventionally antiferromagnetic coupling is denoted −1, OFF is denoted 0, and ferromagnetic coupling denoted +1. Thus OFF is a value amongst the ON states. Since a programming configuration does not change the physical arrangement (i.e., the "architecture") of the qubits and coupling devices in the quantum processor, multiple programming configurations may exist for any given architecture of a quantum processor. In other words, the architecture of a quantum processor is determined or fixed at the time of manufacture and the configuration of the quantum processor which may correspond to a given coupling device being ON/OFF is determined by programming the problem instance into the fixed architecture of the quantum processor.

A "unit cell" is a repeated sub-portion of a quantum processor architecture comprising qubits and coupling devices. Therefore, a plurality of unit cells tiled over an area of a quantum processor produces a certain quantum processor architecture. A unit cell comprises at least two qubits, and may comprise more qubits, such as eight qubits. Each qubit in a unit cell may be included in only one unit cell such that no qubit may be included in multiple unit cells and no qubit may be shared among unit cells. New quantum processor architectures according to the present systems and devices may employ different physical arrangements with respect to known arrangements, such as those described in US Patent Publication 2011-0022820. For example, as compared to known arrangements the new quantum processor architectures may longitudinally shift the physical positions of at least some qubits with respect to some other qubits so that a portion of a longitudinally-shifted qubit in a unit cell may cross the at least a portion of at least one qubit in another unit cell and produce different inter-cell interactions between qubits in different/adjacent unit cells. As used herein and in the claims the term cross, and variants thereof such as crosses or crossing, includes overlie, underlie, and overlap. Thus, crosses includes, for example, the situation where an outline of a portion of a first qubit on one layer or substrate is projected perpendicularly from that portion, layer or substrate and the projection intersects an outline of a respective portion of a second qubit on another layer or substrate.

In accordance with some embodiments of the present systems and devices, a quantum processor may be designed to perform adiabatic quantum computation and/or quantum annealing. An evolution Hamiltonian is proportional to the sum of a first term proportional to the problem Hamiltonian and a second term proportional to the disordering Hamiltonian. As previously discussed, a typical evolution may be represented by equation 1:

$$H_E \propto A(t)H_D + B(t)H_P \qquad (1)$$

where $H_P$ is the problem Hamiltonian, disordering Hamiltonian is $H_D$, $H_E$ is the evolution or instantaneous Hamiltonian, and A(t) and B(t) are an example of evolution coefficients which control the rate of evolution. In general, evolution coefficients vary from 0 to 1. In some embodiments, a time varying evolution coefficient is placed on the problem Hamiltonian. A common disordering Hamiltonian is shown in equation 2:

$$H_D \propto -\frac{1}{2}\sum_{i=1}^{N}\Delta_i\sigma_i^x \qquad (2)$$

where N represents the number of qubits, $\sigma_i^x$ is the Pauli x-matrix for the $i^{th}$ qubit and Δ is the single qubit tunnel splitting induced in the $i^{th}$ qubit. Here, the $\sigma_i^x$ terms are examples of "off-diagonal" terms. A common problem Hamiltonian includes first component proportional to diagonal single qubit terms and a second component proportional to diagonal multi-qubit terms. The problem Hamiltonian, for example, may be of the form:

$$H_P \propto -\frac{\varepsilon}{2}\left[\sum_{i=1}^{N}h_i\sigma_i^z + \sum_{j>i}^{N}J_{ij}\sigma_i^z\sigma_j^z\right] \qquad (3)$$

where N represents the number of qubits, $\sigma_i^z$ is the Pauli z-matrix for the $i^{th}$ qubit, $h_i$ and $J_{i,j}$ are dimensionless local fields coupled into each qubit, and ε is some characteristic energy scale for $H_P$. Here, the $\sigma_i^z$ and $\sigma_i^z\sigma_j^z$ terms are examples of "diagonal" terms. The former is a single qubit term and the latter a two qubit term. Throughout this specification, the terms "final Hamiltonian" and "problem Hamiltonian" are used interchangeably. Hamiltonians such as $H_D$ and $H_P$ in equations 2 and 3, respectively, may be physically realized in a variety of different ways. A particular example is realized by an implementation of superconducting qubits.

FIG. 1 is a schematic diagram of a portion of an exemplary superconducting quantum processor 100 designed for quantum annealing (and/or adiabatic quantum computing) components from which may be used to implement the present systems and devices. The portion of superconducting quantum processor 100 shown in FIG. 1 includes two superconducting qubits 101, 102 and a tunable ZZ-coupler 111 coupling information therebetween (i.e., providing pair-wise coupling between qubits 101 and 102). While the portion of quantum processor 100 shown in FIG. 1 includes only two qubits 101, 102 and one coupler 111, those of skill in the art will appreciate that quantum processor 100 may include any number of qubits and any number of coupling devices coupling information therebetween.

The portion of quantum processor 100 shown in FIG. 1 may be implemented to physically realize adiabatic quantum computing and/or quantum annealing by initializing the system with the Hamiltonian described by equation 2 and evolving the system to the Hamiltonian described by equation 3 in accordance with the evolution described by equation 1. Quantum processor 100 includes a plurality of interfaces 121-125 that are used to configure and control the state of quantum processor 100. Each of interfaces 121-125 may be realized by a respective inductive coupling structure, as illustrated, as part of a programming subsystem and/or an evolution subsystem. Such a programming subsystem and/or evolution subsystem may be separate from quantum processor 100, or it may be included locally (i.e., on-chip with quantum processor 100) as described in, for example, U.S. Pat. No. 7,876,248 and U.S. Pat. No. 8,035,540.

In the operation of quantum processor 100, interfaces 121 and 124 may each be used to couple a flux signal into a respective compound Josephson junction 131,132 of qubits 101 and 102, thereby realizing the $\Delta_i$ terms in the system Hamiltonian. This coupling provides the off-diagonal $\sigma^x$ terms of the Hamiltonian described by equation 2 and these flux signals are examples of "disordering signals." Similarly, interfaces 122 and 123 may each be used to couple a flux signal into a respective qubit loop of qubits 101 and 102, thereby realizing the $h_i$ terms in the system Hamiltonian. This coupling provides the diagonal $\sigma^z$ terms of equation 3. Furthermore, interface 125 may be used to couple a flux signal into coupler 111, thereby realizing the $J_{ij}$ term(s) in the system Hamiltonian. This coupling provides the diagonal $\sigma^z_i\sigma^z_j$ terms of equation 3. In FIG. 1, the contribution of each of interfaces 121-125 to the system Hamiltonian is indicated in boxes 121a-125a, respectively. Thus, throughout this specification and the appended claims, the terms "problem formulation" and "configuration of a number of programmable parameters" are used to refer to, for example, a specific assignment of $h_i$ and $J_{ij}$ terms in the system Hamiltonian of a superconducting quantum processor via, for example, interfaces 121-125.

Throughout this specification and the appended claims, the term "quantum processor" is used to generally describe a collection of physical qubits (e.g., qubits 101 and 102) and couplers (e.g., coupler 111). The physical qubits 101 and 102 and the couplers 111 are referred to as the "programmable elements" of the quantum processor 100 and their corresponding parameters (e.g., the qubit $h_i$ values and the coupler $J_{ij}$ values) are referred to as the "programmable parameters" of the quantum processor. In the context of a quantum processor, the term "programming subsystem" is used to generally describe the interfaces (e.g., "programming interfaces" 122, 123, and 125) used to apply the programmable parameters (e.g., the $h_i$ and $J_{ij}$ terms) to the programmable elements of the quantum processor 100 and other associated control circuitry and/or instructions. As previously described, the programming interfaces of the programming subsystem may communicate with other subsystems which may be separate from the quantum processor or may be included locally on the processor. Similarly, in the context of a quantum processor, the term "evolution subsystem" is used to generally describe the interfaces (e.g., "evolution interfaces" 121 and 124) used to evolve the programmable elements of the quantum processor 100 and other associated control circuitry and/or instructions. For example, the evolution subsystem may include annealing signal lines and their corresponding interfaces (121, 124) to the qubits (101, 102).

Quantum processor 100 also includes readout devices 141 and 142, where readout device 141 is configured to read out the state of qubit 101 and readout device 142 is configured to read out the state of qubit 102. In the embodiment shown in FIG. 1, each of readout devices 141 and 142 comprises a respective DC-SQUID that is configured to inductively couple to the corresponding qubit (qubits 101 and 102, respectively). In the context of quantum processor 100, the term "readout subsystem" is used to generally describe the readout devices 141, 142 used to read out the final states of the qubits (e.g., qubits 101 and 102) in the quantum processor to produce a bit string. The readout subsystem may also include other elements, such as routing circuitry (e.g., latching elements, a shift register, or a multiplexer circuit) and/or may be arranged in alternative configurations (e.g., an XY-addressable array, an XYZ-addressable array, etc.). Qubit readout may also be performed using alternative circuits, such as that described in PCT Patent Publication 2012-064974.

While FIG. 1 illustrates only two physical qubits 101, 102, one coupler 111, and two readout devices 141, 142, a quantum processor (e.g., processor 100) may employ any number of qubits, couplers, and/or readout devices, including a larger number (e.g., hundreds, thousands or more) of qubits, couplers and/or readout devices. The application of the teachings herein to processors with a different (e.g., larger) number of computational components should be readily apparent to those of ordinary skill in the art.

Examples of superconducting qubits include superconducting flux qubits, superconducting charge qubits, and the like. In a flux qubit the Josephson energy dominates or is equal to the charging energy. In a charge qubit it is the reverse. Examples of flux qubits that may be used include rf-SQUIDs, which include a superconducting loop interrupted by one Josephson junction, persistent current qubits, which include a superconducting loop interrupted by three Josephson junctions, and the like. See e.g., Mooij et al., 1999, *Science* 285, 1036; and Orlando et al., 1999, *Phys. Rev. B* 60, 15398. Other examples of superconducting qubits can be found, for example, in Bocko, et al., 1997 IEEE Trans. on Appl. Supercond. 7, 3638; Friedman, et al., 2000, *Nature* 406, 43; and Harris, et al., 2010, *Phys. Rev. B* 81, 134510. In addition, hybrid charge-phase qubits may also be used. Further details of superconducting qubits may be found in Makhlin, et al., 2001, Rev. Mod. Phys. 73, 357; Devoret et al., 2004, arXiv: cond-mat/0411174; Zagoskin and Blais, 2007, *Physics in Canada* 63, 215; Clarke and Wilhelm, 2008, *Nature* 453, 1031; Martinis, 2009, *Quantum Inf. Process.* 8, 81; and Devoret and Schoelkopf, 2013, *Science* 339, 1169.

The qubits and coupling devices in a quantum processor may be arranged into an architecture such that a certain number of qubits may be laid out into a unit cell of qubits (hereinafter, "unit cell"). A unit cell may comprise of at least two qubits. For example, US Patent Publication 2011-0022820 describes a unit cell comprising eight qubits, four of which are laid out parallel to each other in a first set and four of which are laid out parallel to each other in a second set where the first set of qubits is perpendicular to the second set of qubits and a portion of a qubit in the first set of qubits crosses a respective portion of every qubit in the second set of qubits. A plurality of unit cells is tiled across an area of the quantum processor which represents the layout of qubits in the quantum processor architecture. As described in US Patent Publication 2011-0022820, coupling devices are used to couple qubits in different sets of qubits in the same unit cell that cross one another and to couple qubits in the same set of qubits in adjacent unit cells. In US Patent Publication 2011-0022820, no qubits in one unit cell crosses another qubit in another unit cell. Although a qubit in one unit cell described in US Patent Publication 2011-0022820 is strongly coupled to at least four other qubits in the same unit cell, inter-cell interaction is limited to unit cells that may be positioned immediately adjacent (i.e., nearest neighbor) to a unit cell in the horizontal and/or vertical direction. In US Patent Publication 2011-0022820, no unit cells positioned immediately adjacent to a unit cell in a diagonal direction (i.e., next nearest neighbor) may interact with the unit cell and therefore limited interaction is realized between unit cells. While the fixed architecture described in US Patent Publication 2011-0022820 may still be suitable for certain problems, certain other problem instances may benefit from new quantum processor architectures with overlapping qubits between unit cells resulting in a different inter-cell interaction.

Figure 2:
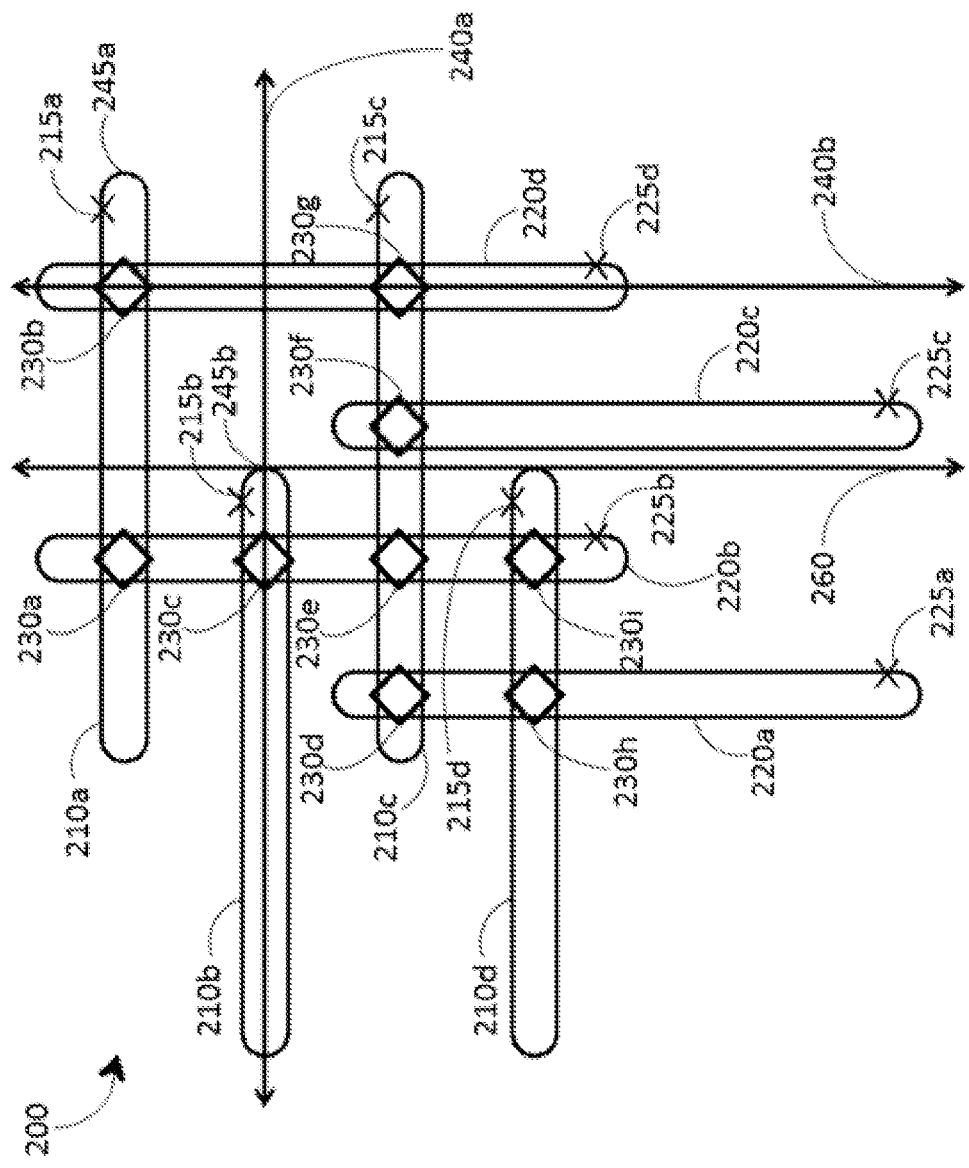
FIG. 2 is a schematic diagram of an exemplary unit cell forming the basis of a quantum processor architecture in accordance with the present systems and devices.

FIG. 2 shows an exemplary unit cell 200 forming the basis of a quantum processor architecture in accordance with the present systems and devices. Unit cell 200 includes qubits 210a-d (collectively 210) which are laid out horizontally in FIGS. 2 and 220a-d (collectively 220) which are laid out vertically in FIG. 2. As previously described, unit cell 200 represents a single unit cell in a quantum processor, whereas the corresponding quantum processor architecture may comprise a plurality of unit cells 200 tiled over an area. A complete processor architecture may employ multiple unit cells 200, with each individual unit cell 200 being positioned adjacent (i.e., neighboring) at least one other unit cell 200. A person of skill in the art will appreciate that while eight qubits are illustrated in unit cell 200, this number is arbitrary and unit cell 200 may comprise more or fewer than eight qubits (but must comprise at least two qubits). Qubits 210, 220 may be superconducting qubits. Each qubit 210*a-d* may be a respective loop of superconducting material elongated along a respective longitudinal axis 240*a* (only one longitudinal axis of each qubit 210*a-d* is called out in FIG. 2 to reduce clutter) and interrupted by at least one respective Josephson junction 215*a-d*. Each qubit 220*a-d* may be a respective loop of superconducting material elongated along a respective longitudinal axis 240*b* (only one longitudinal axis of each qubit 220*a-d* is called out in FIG. 2 to reduce clutter) and interrupted by at least one respective Josephson junction 225*a-d*. Each of horizontal qubits 210 are laid out substantially parallel to one another (i.e., respective longitudinal axes parallel to one another and parallel to longitudinal axis 240*a* in FIG. 2) and each of vertical qubits 220 are laid out substantially parallel to one another (i.e., respective longitudinal axes parallel to one another and parallel to longitudinal axis 240*b* in FIG. 2). Longitudinal axis 240*a* is substantially perpendicular to longitudinal axis 240*b*. Each of horizontal qubits 210 are in a first set of qubits and each of vertical qubits 220 are in a second set of qubits where the respective longitudinal axes of the qubits in the first set of qubits is perpendicular the respective longitudinal axes of the qubits in the second set of qubits.

Some problems may be solved by embedding the problem into a quantum processor that is well designed for embedding the particular problem. For instance, it may be advantageous to employ a fixed quantum processor architecture that is different or modified from the fixed quantum processor architecture described in, for example US Patent Publication 2011-0022820. Such different or modified architecture may, for instance, allow better embedding and/or solution of certain problems. With respect to the fixed quantum processor architecture described in, for example US Patent Publication 2011-0022820, longitudinally shifting a position of some qubits with respect to a position of other qubits may produce different or modified quantum processor architectures with different qubit interaction patterns between qubits in adjacent unit cells.

For example, in unit cell 200 illustrated in FIG. 2, qubits 210*b* and 210*d* are shifted, staggered or offset longitudinally (e.g., horizontally as illustrated in FIG. 2) with respect to qubits 210*a* and 210*c*, such that qubits 210*b* and 210*d* are not aligned in a same column (e.g., vertically as illustrated in FIG. 2) as qubits 210*a* and 210*c*. More specifically, qubits 210*b* and 210*d* are longitudinally shifted, staggered or offset such that a transverse axis 260 of qubits 210*b* and 210*d* that passes through a respective end of each of qubits 210*b* and 210*d* (e.g., end 245*b* of qubit 210*b*) does not pass through the corresponding ends of each of qubits 210*a* and 210*c* (e.g., end 245*a* of qubit 210*a*). Likewise, qubits 220*a* and 220*c* are shifted, staggered or offset longitudinally (e.g., vertically as illustrated in FIG. 2) with respect to qubits 220*b* and 220*d*, such that qubits 220*b* and 220*d* are not aligned in a same row (e.g., horizontally as illustrated in FIG. 2) as qubits 220*a* and 220*c*. In other words, qubits with parallel longitudinal axes may be longitudinally offset relative to at least the nearest neighbor qubit with a parallel longitudinal axis such that the qubit is not aligned with at least that nearest neighbor in a direction that is perpendicular to the longitudinal axes.

Which qubit is actually said to be "shifted longitudinally" or staggered or offset with respect to the other qubit is arbitrary, and is used in its relative sense. When a first qubit is shifted longitudinally with respect to a second qubit, it is to be understood that the second qubit may also considered to be shifted longitudinally with respect to the first qubit. Thus, shifted refers to the relative position of two qubits, the position of either one or both of the qubits equally capable of serving as a reference point with respect to which a shift of the other qubit is specified.

The amount by which qubits 210*b* and 210*d* are longitudinally shifted, staggered, offset, or out of alignment or unaligned with one another may influence the couplings and interactions between adjacent unit cells when unit cell 200 is tiled over an area to form a complete quantum processor architecture. In the illustrative example of FIG. 2, qubits 210*b* and 210*d* are longitudinally shifted, staggered or offset by approximately 50% of their total length along their respective longitudinal axes. For example, qubit 210*b* is shifted by 50% of its total length along longitudinal axis 240*a* such that transverse axis 260 that passes through end 245*b* of qubit 210*b* also extends through (i.e., intersects or crosses) an approximate midpoint between the two ends of qubits 210*a* and 210*c*. In other words, transverse axis 260 intersects end 245*b* of qubit 210*b* and bisects qubits 210*a* and 210*c*. As discussed in more detail later, this particular amount of shifting (i.e., by 50% of the total qubit length) may enable each of qubits 210*b* and 210*d* to cross and/or communicatively couple to at least two other qubits in an adjacent unit cell (not shown in FIG. 2); however, other shifting or staggering or offset schemes or arrangements and/or amounts (e.g., shifting by any percentage, such as 10%, 25%, 60%, 75%, or other dimensional measurement) may be employed in accordance with the present system and devices.

The longitudinal shifting, staggering or offsetting of substantially parallel qubits may also be based on the number of qubits in adjacent unit cells that may cross the longitudinally shifted qubit as a result of the amount shifted. For example, a qubit may be longitudinally shifted by an amount that may enable only one qubit in an adjacent unit cell to cross the longitudinally shifted qubit. A qubit may be longitudinally shifted by another amount such that two qubits in an adjacent unit cell may cross the longitudinally shifted qubit. Similarly, a qubit may be longitudinally shifted by any amount such that a plurality of qubits in an adjacent unit cell may cross the longitudinally shifted qubit depending on the length of the qubit and the number of qubits in a unit cell. For example, a qubit longitudinally shifted by an amount sufficient for one qubit from an adjacent unit cell to cross the longitudinally shifted qubit corresponds to a 25% shift of the total qubit length in a unit cell comprising eight qubits with four qubits laid out in a first direction (e.g., horizontally) and four qubits laid out in a second direction (e.g., vertically) perpendicular to the first direction. Similarly, a qubit longitudinally shifted by an amount sufficient for two qubits from an adjacent unit cell to cross the longitudinally shifted qubit corresponds to a 50% shift of the total qubit length and so on.

Qubits 210, 220 may be longitudinally shifted, staggered, moved, offset or positioned to produce new unit cell layouts resulting in new quantum processor architectures. For example, qubits 210*b* and 210*d* may each be longitudinally shifted by approximately 25% of their total length along their respective longitudinal axes, such that transverse axis 260 that passes through end 245*b* of qubit 210*b* intersects qubit 210*a* (and qubit 210*c*) at a point approximately a quarter of the way along the length of qubit 210*a* (and qubit 210*c*).

In unit cell 200 of FIG. 2, both horizontal qubits 210*b* and 210*d* are longitudinally shifted, staggered or offset by the same amount and both vertical qubits 220*a* and 220*c* are longitudinally shifted, staggered or offset by the same amount. In accordance with the present systems and devices, any number of qubits in a unit cell may be longitudinally shifted, staggered or offset and not all longitudinally shifted, staggered or offset qubits may necessarily be shifted, staggered or offset by the same amount.

The lengths of qubits 210, 220 may also affect the quantum processor architecture. For example, increasing the length of qubits 210a-d, 220a-d provides a larger dimension along which crossings may occur, thereby allowing more crossing qubits to be provided on a chip of a given area. In a way similar to that described for the portion of processor 100 from FIG. 1, coupling devices 230a-230i (collectively 230) may provide pair-wise communicative coupling between respective pairs of qubits 210, 220. Specifically, each of coupling devices 230 provides communicative coupling between a horizontal qubit 210 and a vertical qubit 220 at a region proximate where the horizontal qubit 210 and the vertical qubit 220 cross one another. Each coupling device 230a-i may be a respective loop of superconducting material interrupted by at least one respective Josephson junction. Coupling devices 230 may be tunable as described in, for example U.S. Pat. Nos. 7,619,437, 7,969,805 and 7,898,282, etc. in that the coupling created between two respective qubits 210, 220 by coupling devices 230 may be changed during the operation of a quantum processor.

Unit cell 200 may be laid out into an integrated circuit. The integrated circuit may be multi-layered. There may be at least two layers of metal in the integrated circuit. At least a portion of each qubit 210a-d may be laid out in a first metal layer of the integrated circuit. At least a portion of each qubit 220a-d may be laid out in a second metal layer of the integrated circuit. For example, horizontal qubit 210a and vertical qubit 220b may both be laid out in the first metal layer and a portion of qubit 220b may briefly change layers (i.e., switch to the second metal layer) to tunnel under/bridge over qubit 210a at an approximate position where qubit 220b crosses qubit 210a. Alternatively, a portion of qubit 210a may briefly change layers (i.e., switch to the second metal layer) to tunnel under/bridge over qubit 220b at an approximate position where qubit 220b crosses qubit 210a.

At least a portion of each coupling device may be laid out in the first metal layer and/or the second metal layer and/or a third metal layer. The third metal layer may be interposed between the first metal layer and the second metal layer. For example, coupling devices 230a-i may exist in the first, second or third metal layer or in the first and second, second and third or first and third metal layers or the first, second and third metal layers. Vias may be used within qubits 210, 220 and/or coupling devices 230 to bridge any or all of the first, second and third metal layers together.

On-chip control circuitry may be laid out efficiently within areas within the grid defined by the qubits 210 and 220. Examples of on-chip control circuitry can be found in U.S. Pat. Nos. 7,876,248, 8,098,179, 7,843,209, 8,018,244, 8,169,231 and U.S. Patent Publication 2012-0094838.

Figure 3:
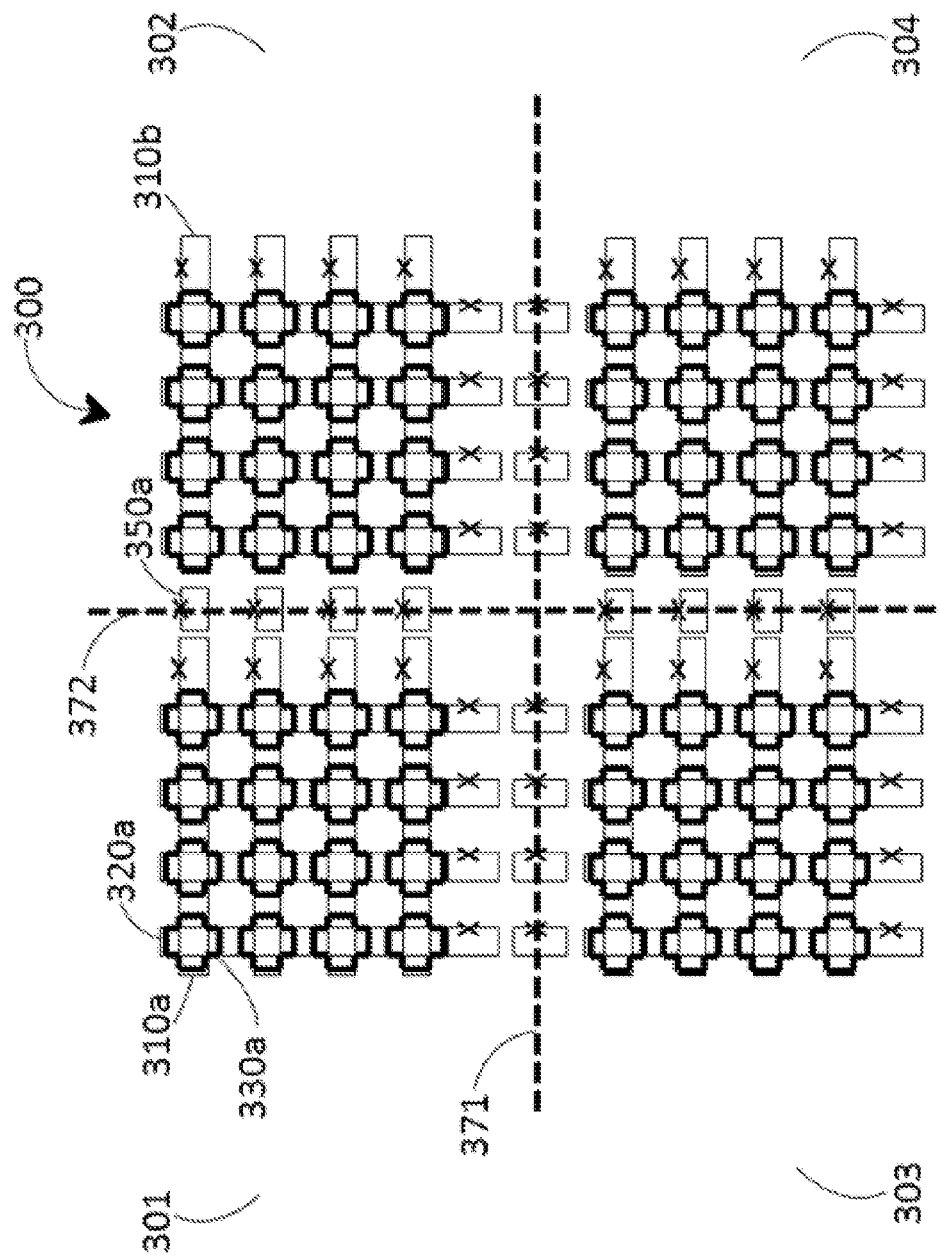
FIG. 3 is a schematic diagram of a quantum processor architecture.

Tiling unit cells of qubits across an area of the quantum processor forms the basis of the processor architecture. Unit cells tiled across an area of the quantum processor produces the complete processor architecture. FIG. 3 shows a quantum processor architecture 300 based on for example US Patent Publication 2011-0022820. Architecture 300 may be a portion of a quantum processor comprised of a plurality of unit cells (referred to as "subtopologies" in US Patent Publication 2011-0022820) tiled over an area such that each unit cell is positioned adjacent at least one other unit cell. Architecture 300 comprises unit cells 301, 302, 303, 304. Each unit cell comprises horizontal and vertical qubits (e.g., horizontal qubits 310a, 310b and vertical qubit 320a) and coupling devices which communicatively couple qubits in the same unit cell where a horizontal and vertical qubit crosses (e.g., coupling device 330a) and where two horizontal or vertical qubits of different unit cells are communicatively coupled together (e.g., coupling device 350a). Horizontal axis 371 and vertical axis 372 divides the quantum processor architecture into four quadrants with a single unit cell being contained within each respective quadrant. For example, unit cell 301 is contained within the upper-leftmost quadrant defined by the region above horizontal axis 371 and to the left of vertical axis 372. In other words, no unit cell crosses either horizontal axis 371 or vertical axis 372 and therefore, no qubit in a unit cell crosses a qubit in another unit cell. In the illustrative example of FIG. 3, each unit cell 301, 302, 303, 304 comprises eight qubits, four of which are laid out in a first set of qubits and four of which are laid out in a second set of qubits such that all of unit cells 301, 302, 303, 304 contained within a respective quadrant of architecture 300 are substantially similar to one another (i.e., respective 4-by-4 arrays of qubits). In architecture 300, inter-cell interaction or communicative coupling is established by coupling between qubits placed immediately adjacent each other in different unit cells. For example, horizontal qubit 310a of unit cell 301 and horizontal qubit 310b of unit cell 302 are communicatively coupled together via coupling device 350a. A feature of architecture 300 is that a unit cell may interact with a maximum of four other unit cells by establishing inter-cell coupling between adjacent unit cells. Since coupling devices that communicatively couple between qubits in two different unit cells may belong to both respective unit cells, FIG. 3 shows horizontal axis 371 and vertical axis 372 bisecting the coupling devices coupling qubits in different unit cells. While some problems may be solved using a quantum processor with an architecture similar to architecture 300, altering architecture 300 by rearranging the qubit positions may be advantageous for solving some other problems. In other words, shifting, staggering or offsetting the qubits in a unit cell with respect to at least nearest neighbor qubits in the unit cell and/or tiling the unit cells across an area of the quantum processor, may enable crossings between qubits in different unit cells resulting in new quantum processor architectures that may better suit for solving certain problems that are otherwise difficult to embed into architecture 300.

Figure 4:
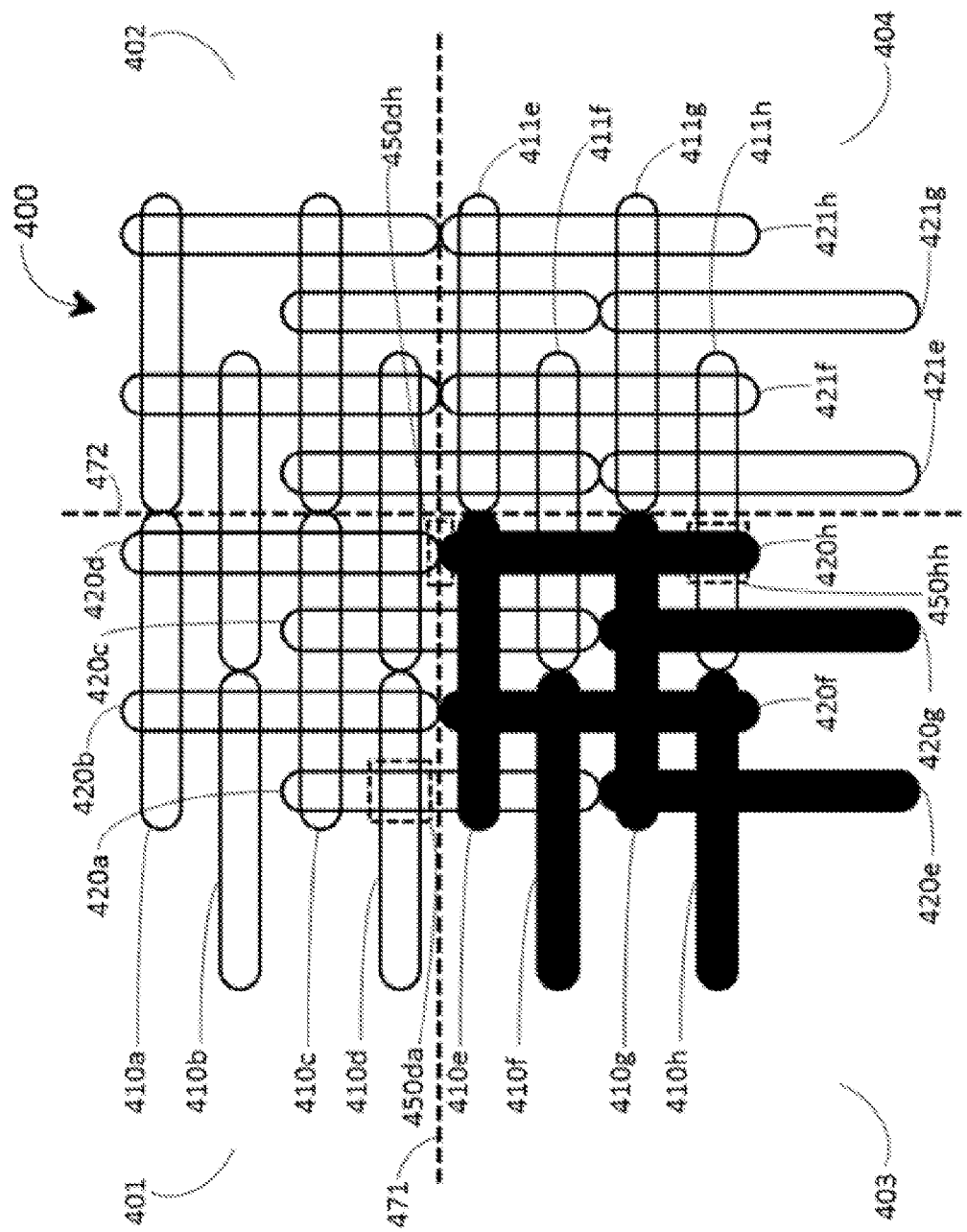
FIG. 4 is a schematic diagram of a quantum processor architecture based on the unit cell from FIG. 2 in accordance with the present systems and devices.

FIG. 4 shows a quantum processor architecture 400 based on unit cell 200 from FIG. 2 in accordance with the present systems and devices. Architecture 400 may be laid out into or implemented as an integrated circuit. The integrated circuit may be multi-layered. There may be at least two layers of metal in the integrated circuit. Architecture 400 comprises unit cells 401, 402, 403, 404 (only four illustrated but a larger or smaller number may be employed). As illustrated in FIG. 4, each unit cell 401, 402, 403, 404 is substantially similar to unit cell 200 from FIG. 2. Architecture 400 may be a portion of a quantum processor comprised of a plurality of unit cells tiled over an area such that each unit cell is positioned adjacent (e.g., proximate or neighboring) at least one other unit cell in accordance with the present systems and devices. Unit cell 401 is positioned immediately next to unit cell 402 in a horizontal direction with no other unit cells in between thereby making unit cells 401 and 402 horizontally adjacent (i.e., a nearest neighbor). Similarly, unit cell 403 is positioned immediately next to unit cell 404 in a horizontal direction with no other unit cells in between thereby making unit cells 403 and 404 horizontally adjacent. Unit cell 401 is positioned immediately next to unit cell 403 in a vertical direction with no other unit cells in between thereby making unit cells 401 and 403 vertically adjacent (i.e., a nearest neighbor). Similarly, unit cell 402 is positioned immediately next to unit cell 404 in a vertical direction with no other unit cells in between thereby making unit cells 402 and 404 vertically adjacent. Unit cell 401 is positioned immediately next to unit cell 404 in a diagonal direction with no other unit cells in between thereby making unit cells 401 and 404 diagonally adjacent (i.e., a next nearest neighbor). Similarly, unit cell 402 is positioned immediately next to unit cell 403 in a diagonal direction with no other unit cells in between thereby making unit cells 402 and 403 diagonally adjacent. Those of skill in the art will appreciate that this assignment of vertical, horizontal and diagonal directions is arbitrary, vertical and horizontal used to conveniently denominate first and second substantially perpendicular directions, and diagonal to denominate a direction not perpendicular to either the first or second directions. Thus, the terms vertical, horizontal and diagonal not intended to limit the scope of the present systems and devices in any way.

As previously described, each of unit cells 401, 402, 403, and 404 may be substantially similar to unit cell 200 from FIG. 2. For example, unit cell 401 includes horizontal qubits 410*a-d* which are arranged parallel to each other and vertical qubits 420*a-d* which are arranged parallel to each other and perpendicular to horizontal qubits 410*a-d*; unit cell 403 includes horizontal qubits 410*e-h* which are arranged parallel to each other and vertical qubits 420*e-h* which are arranged parallel to each other and perpendicular to horizontal qubits 410*e-h*; and unit cell 404 includes horizontal qubits 411*e-h* which are arranged parallel to each other and vertical qubits 421*e-h* which are arranged parallel to each other and perpendicular to horizontal qubits 411*e-h*. Qubits in unit cell 402 are not called out in FIG. 4 in order to reduce clutter. Unit cell 403 comprising qubits 410*e-h* and 420*e-h* is filled-in in FIG. 4 to emphasize the layout of a unit cell similar to unit cell 200 of FIG. 2. Qubits 410*a-h*, 420*a-h*, 411 *e-h*, 421 *e-h* may be superconducting qubits. Each qubit 410*a-h*, 420*a-h*, 411 *e-h*, 421 *e-h* may include a respective loop of superconducting material elongated along a respective longitudinal axis (not shown) and interrupted by at least one respective Josephson junction similar to Josephson junctions 215*a-d*, 225*a-d* as shown in FIG. 2. Josephson junctions are not shown in FIG. 4 to improve drawing legibility.

Qubits 410*a-h* and qubits 411 *e-h* may belong to a first set of qubits of the integrated circuit where qubits in the first set of qubits are parallel to each other and laid out horizontally in each unit cell of architecture 400. Qubits 420*a-h* and qubits 421 *e-h* may belong to a second set of qubits of the integrated circuit where qubits in the second set of qubits are parallel to each other and laid out vertically in each unit cell of architecture 400. A qubit in a set of qubits (i.e., first set/second set) may be parallel to each other qubit in the same set of qubits and perpendicular to the qubits in a different set of qubits.

Each qubit is communicatively coupled to at least one other qubit via a respective coupling device. Coupling devices are not shown in FIG. 4 to improve drawing legibility. However, coupling devices communicatively coupling two qubits together in each unit cell 401, 402, 403, 404 of architecture 400 is similar to coupling devices 230*a-i* as shown in FIG. 2.

Depending on the specific qubits being communicatively coupled together and to which unit cell each qubit being coupled together belongs, there may exist at least two kinds of coupling devices, namely intra-cell and inter-cell coupling devices.

An intra-cell coupling device is a coupling device that may be operable to communicatively couple a qubit in a first set of qubits with a qubit in a second set of qubits together where the two qubits belong to the same unit cell. An intra-cell coupling device may be positioned proximate a respective point where a qubit in the first set of qubits in a unit cell crosses a qubit in the second set of qubits in the same unit cell. For example, dotted rectangle 450*da* (hereinafter "region 450*da*." Only one called out in FIG. 4 to reduce clutter) represents an approximate region of the position of the intra-cell coupling device that communicatively couples qubit 410*d* and 420*a* of unit cell 401 together.

An inter-cell coupling device is a coupling device that may be operable to communicatively couple qubits between different units cells. Depending on the set of qubits to which each qubit being communicatively coupled together belongs, inter-cell coupling devices may comprise a first and a second set of coupling devices. A first set of inter-cell coupling devices may communicatively couple qubits in the same set of qubits in different unit cells. In other words, a coupling device in the first set of inter-cell coupling devices may communicatively couple either two horizontal qubits of different unit cells together or two vertical qubits of different unit cells together. The shifting, staggering or offsetting of qubits results in crossings between qubits in different unit cells, allowing an additional set (i.e., a second set) of inter-cell coupling devices that may be operable to communicatively couple qubits in different sets of qubits in different unit cells. In other words, a coupling device in the second set of inter-cell coupling devices may communicatively couple a horizontal and a vertical qubit that cross one another where the horizontal and the vertical qubit belong to different unit cells.

A coupling device in the first set of inter-cell coupling devices may be positioned between a respective pair of qubits in the same set of qubits in adjacent unit cells that are communicatively coupled together. For example, dotted rectangle 450*dh* (hereinafter "region 450*dh*." Only one called out in FIG. 4 to reduce clutter) represents an approximate region of the position of the coupling device in a first set of inter-cell coupling devices that selectively communicatively couples vertical qubits 420*d* of unit cell 401 and 420*h* of unit cell 403 together. Both qubits 420*d* and 420*h* are in the same set (e.g., second set). Unit cells 401, 403 are positioned right next to each other with no other unit cells in between in the vertical direction. Therefore, region 450*dh* represents the approximate region of the position of a coupling device which selectively communicatively couples qubits in the same set of vertically adjacent unit cells.

A second set of inter-cell coupling devices may be positioned proximate a respective point where a respective pair of qubits in different sets of qubits in adjacent unit cells cross one another. For example, dotted rectangle 450*hh* (from hereinafter, "region 450*hh*." Only one called out in FIG. 4 to reduce clutter) may represent an approximate region of the position of a coupling device in a second set of inter-cell coupling devices that selectively communicatively couples longitudinally shifted horizontal qubit 411*h* of unit cell 404 and vertical qubit 420*h* of unit cell 403 together. Qubit 411*h* is laid out in the first set of qubits in the integrated circuit and qubit 420*h* is laid out in the second set. Unit cells 403, 404 are positioned right next to each other with no other unit cells in between in the horizontal direction. Therefore, region 450*hh* represents an approximate region of the position of a coupling device which may establish communicative coupling between different sets of horizontally adjacent unit cells. Only regions 450*dh*, 450*hh* representing approximate regions of the position of two inter-cell coupling devices in the first and the second set of inter-cell coupling devices respectively are called out in FIG. 4 to illustrate communicative coupling between the same set of qubits in adjacent unit cells and between different sets of qubits in adjacent unit cells.

A person of skill in the art will appreciate that regions 450da, 450dh, 450hh are approximations only and the corresponding coupling devices may or may not extend out of regions 450da, 450dh, 450hh. By tiling unit cells over an area such that each unit cell may be positioned horizontally, vertically or diagonally adjacent at least one other unit cell where inter-cell coupling devices may be operable to selectively communicatively couple qubits in the same and different sets of qubits in adjacent unit cells and intra-cell coupling devices may be operable to selectively communicatively couple qubits in different sets of qubits in the same unit cell, a quantum processor architecture may be constructed having qubit interactions that are different from that presented in US Patent Publication 2011-0022820 and that may be better-matched to the complexity of certain problems.

Similar to FIG. 3, horizontal axis 471 and vertical axis 472 divide quantum processor architecture 400 into four quadrants. However, as seen in FIG. 4 at least one unit cell includes a qubit that crosses a boundary between quadrants. For example, unit cell 401 includes qubit 420a that crosses horizontal axis 471 and extends beyond the upper-leftmost quadrant defined by the region above horizontal axis 471 and to the left of vertical axis 472 into the lower-leftmost quadrant defined by the region below horizontal axis 471 and to the left of vertical axis 472. In other words, at least one qubit in each of unit cells 401, 402, and 404 crosses either horizontal axis 471 or vertical axis 472 and therefore, unlike quantum processor architecture 300, at least one qubit in a unit cell crosses a qubit in another unit cell. Inter-cell interaction is established by communicative coupling between qubits placed immediately adjacent each other in different unit cells. For example, vertical qubit 420d of unit cell 401 and vertical qubit 420h of unit cell 403 are selectively communicatively coupled together via a coupling device in the first set of inter-cell coupling devices positioned at approximate region 450dh. In contrast to architecture 300, inter-cell interaction is also established by communicatively coupling between qubits that cross one another in different unit cells. For example, vertical qubit 420h of unit cell 403 is communicatively coupled (via, for example, a coupling device such as coupling devices 230a-230i as illustrated in FIG. 2) to horizontal qubit 411h of unit cell 404 at approximate region 450hh where a portion of qubit 420h crosses a portion of qubit 411h due to the shifting of qubits. Coupling devices operable to selectively provide communicative coupling between pairs of qubits are not shown in FIG. 4 to improve drawing legibility.

A qubit in architecture 400 is communicatively coupled to a maximum of six qubits via inter-cell and intra-cell coupling devices (only five interconnections/couplings out of six can be seen in FIG. 4 as a quantum processor architecture with only four unit cells are shown). Therefore, similar to architecture 300, a qubit in architecture 400 may have a connectivity of six by tiling more unit cells (e.g., 8 unit cells). According to architecture 400, a unit cell may interact with a maximum of six other unit cells by establishing inter-cell communicative coupling between adjacent unit cells. In contrast to architecture 300 where a unit cell may interact with a maximum of four other unit cells, the two additional unit cells that may interact with a single unit cell in architecture 400 is achieved by longitudinal shifting, staggering or offsetting of qubits crossing each other and therefore enabling additional inter-cell communicative couplings between qubits in diagonally adjacent unit cells. Therefore, although a connectivity of six may be achieved by a qubit in both architectures 300 and 400, inter-cell interaction may span across more unit cells in architecture 400 than architecture 300 which may be advantages when embedding some problems into the quantum processor.

The shifting, staggering or offsetting of qubits in a unit cell and tiling of such unit cells across an area of the quantum processor has created a modified quantum processor architecture 400 that is different from quantum processor architecture 300 of FIG. 3b specifically due to the shifted, staggered or offset qubits extending beyond the boundaries of the unit cell enabling crossing of qubits in different unit cells. The modified quantum processor architecture 400 provides a particular qubit interconnection between qubits within the same and different unit cells that may be advantages over existing processor designs for some problems/applications.

Figure 5:
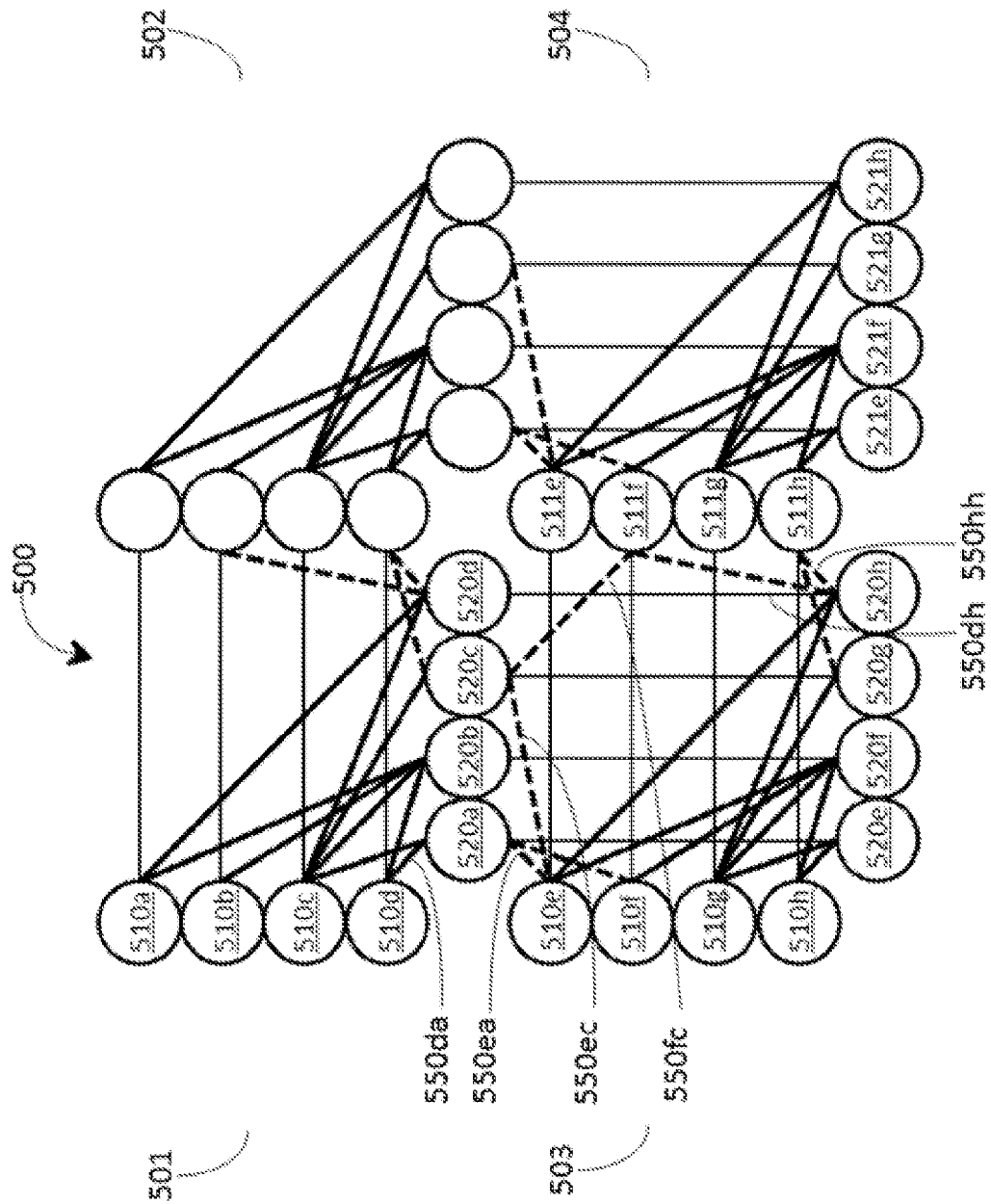
FIG. 5 is a graph illustrating the interconnections realized between the qubits in the quantum processor architecture from FIG. 4, in accordance with the present systems and devices.

FIG. 5 shows a graph 500 illustrating the interconnections realized between the qubits in quantum processor architecture 400 from FIG. 4, in accordance with the present systems and devices. Graph 500 comprises subgraphs 501, 502, 503, 504. Each subgraph 501, 502, 503, 504 represents the interconnections of a respective unit cell 401, 402, 403, and 404 from architecture 400. As illustrated, subgraph 501 is positioned immediately next to subgraph 502 in a horizontal direction with no other subgraphs in between thereby making subgraphs 501 and 502 horizontally adjacent. Similarly, subgraph 503 is positioned immediately next to subgraph 504 in a horizontal direction with no other subgraphs in between thereby making subgraphs 503 and 504 horizontally adjacent. Subgraph 501 is positioned immediately next to subgraph 503 in a vertical direction with no other subgraphs in between thereby making subgraphs 501 and 503 vertically adjacent. Similarly, subgraph 502 is positioned immediately next to subgraph 504 in a vertical direction with no other subgraphs in between thereby making subgraphs 502 and 504 vertically adjacent. Subgraph 501 is positioned immediately next to subgraph 504 in a diagonal direction with no other subgraphs in between thereby making subgraphs 501 and 504 diagonally adjacent. Similarly, subgraph 502 is positioned immediately next to subgraph 503 in a diagonal direction with no other subgraphs in between thereby making subgraphs 502 and 503 diagonally adjacent. As previously noted, those of skill in the art will appreciate that this assignment of vertical, horizontal and diagonal directions is arbitrary, used as a convenient notation, and not intended to limit the scope of the present systems and devices in any way.

Sub-graph 501 may include vertices 510a, 510b, 510c, 510d which may correspond to qubits 410a, 410b, 410c, 410d from FIG. 4 which are parallel to each other and vertices 520a, 520b, 520c, 520d which may correspond to qubits 420a, 420b, 420c, 420d from FIG. 4 which are parallel to each other and perpendicular to qubits 410a, 410b, 410c, 410d. Sub-graph 503 comprises vertices 510e, 510f, 510g, 510h which may correspond to qubits 410e, 410f, 410g, 410h from FIG. 4 which are parallel to each other and vertices 520e, 520f, 520g, 520h which may correspond to qubits 420e, 420f, 420g, 420h from FIG. 4 which are parallel to each other and perpendicular to qubits 410e, 410f, 410g, 410h. Sub-graph 504 may comprise vertices 511e, 511f, 511g, 511h which may correspond to qubits 411e, 411f, 411g, 411h from FIG. 4 which are parallel to each other and vertices 521e, 521f, 521g, 521h which may correspond to qubits 421e, 421f, 421g, 421h from FIG. 4 which are parallel to each other and perpendicular to qubits 411e, 411f, 411g, 411h.

Vertices may represent qubits and edges/lines may represent couplings established between qubits. Only vertices in subgraphs 501, 503, 504 are called out in FIG. 5 for further discussion. The purpose of FIG. 5 is to illustrate the interconnections or communicative couplings established between qubits in quantum processor architecture 400 of FIG. 4. All communicative couplings that are established between qubits within unit cells 401, 402, 403, 404 in FIG. 4 are represented by lines/edges in FIG. 5. Specifically, thin solid lines connecting two vertices together represent a first set of inter-cell couplings established between qubits in the same set of qubits in adjacent unit cells. For example, according to FIG. 4, vertical qubit 420*d* of unit cell 401 is communicatively coupled to vertical qubit 420*h* of unit cell 403 at approximately region 450*dh* so that inter-cell communicative coupling between the two vertical qubits may be established. Vertices 520*d*, 520*h* of FIG. 5 represent corresponding vertical qubits 420*d*, 420*h*. Vertex 520*d* belongs to subgraph 501 and vertex 520*h* belongs to subgraph 503 where subgraphs 501, 503 represent vertically adjacent unit cells 401, 403 respectively. Therefore, thin solid line 550*dh* connecting vertex 520*d* of subgraph 501 and vertex 520*h* of subgraph 503 represents a first set of inter-cell communicative coupling established between corresponding vertical qubits 420*d* of unit cell 401 and 420*h* of unit cell 403.

Dotted lines connecting two vertices together represent a second set of inter-cell communicative couplings established between qubits in different sets of qubits in adjacent unit cells. For example, dotted line 550*ec* connecting vertex 510*e* of subgraph 503 and vertex 520*c* of subgraph 501 represents a second set of inter-cell communicative coupling established between corresponding horizontal qubit 410*e* of unit cell 403 and vertical qubit 420*c* of unit cell 401. Thick solid lines connecting two vertices together represent intra-cell communicative couplings established between qubits in different sets of qubits in the same unit cell. For example, according to FIG. 4, qubits 410*d* and 420*a* of unit cell 401 crosses each other at approximately region 450*da* where an intra-cell coupling device may selectively communicatively couple qubits 410*d* and 420*a* together. Vertices 510*d*, 520*a* of FIG. 5 represent corresponding horizontal qubit 410*d* and vertical qubit 420*a*. Both vertices 510*d*, 520*a* belong to subgraph 501 representing unit cell 401 in FIG. 4. Therefore, thick solid line 550*da* connecting vertices 510*d* and 520*a* of subgraph 501 represents intra-cell communicative coupling established between corresponding horizontal qubit 410*d* and vertical qubit 420*a* of unit cell 401.

Longitudinally shifting, staggering or offsetting qubits in a unit cell as shown in FIG. 2 and tiling such unit cells over an area of the quantum processor such that each unit cell is positioned adjacent at least one other unit cell may enable crossing between qubits in different sets in adjacent unit cells.

According to FIG. 4, qubit 410*e* of unit cell 403 crosses longitudinally shifted qubits 420*a* and 420*c* of unit cell 401. Unit cells 401, 403 are positioned right next to each other with no other unit cells in between in the vertical direction. Respective coupling devices may be positioned proximate a point where qubit 410*e* crosses qubit 420*a* and proximate a point where qubit 410*e* crosses qubit 420*c* so that inter-cell communicative coupling may be established. This "vertical" inter-cell communicative coupling is represented by dotted line 550*ea* connecting vertices 510*e* and 520*a* together and dotted line 550*ec* connecting vertices 510*e* and 520*c* together in FIG. 5. Vertex 510*e* belongs to subgraph 503 and vertices 520*a*, 520*c* belong to subgraph 501 where subgraphs 501 and 503 represent unit cells positioned right next to each other with no other unit cells in between in the vertical direction (i.e., unit cells 401 and 403 from FIG. 4, respectively). Therefore, dotted lines 550*ea*, 550*ec* represents a second set of inter-cell communicative coupling established between qubits in different sets of qubits in vertically adjacent unit cells.

According to FIG. 4, qubit 420*h* of unit cell 403 crosses longitudinally shifted, staggered or offset qubit 411*h* of unit cell 404 at approximately region 450*hh*. Unit cells 403, 404 are positioned right next to each other with no other unit cells in between in the horizontal direction. A coupling device may be positioned proximate a point where qubit 420*h* crosses qubit 411*h* so that inter-cell communicative coupling may be selectively established. This "horizontal" inter-cell communicative coupling is represented by dotted line 550*hh* connecting corresponding vertices 520*h* and 511*h* together in FIG. 5. Vertex 520*h* belongs to subgraph 503 and vertex 511*h* belongs to subgraph 504 where subgraphs 503, 504 represent unit cells positioned right next to each other with no other unit cells in between in the horizontal direction (i.e., unit cells 403 and 404 from FIG. 4, respectively). Therefore, dotted line 550*hh* may represent a second set of inter-cell communicative coupling established between qubits in different sets of qubits in horizontally adjacent unit cells.

According to FIG. 4, longitudinally shifted qubit 420*c* of unit cell 401 crosses longitudinally shifted qubit 411*f* of unit cell 404. Unit cells 401, 404 are positioned immediately next to each other with no other unit cells in between in a diagonal direction. A coupling device may be positioned proximate a point where qubit 420*c* crosses qubit 411*f* so that inter-cell communicative coupling may be selectively established. This "diagonal" inter-cell communicative coupling is represented by dotted line 550*fc* connecting corresponding vertices 520*c* and 511*f* together in FIG. 5. Vertex 520*c* belongs to subgraph 501 and vertex 511*f* belongs to subgraph 504 where subgraphs 501, 504 represent unit cells positioned right next to each other with no other unit cells in between in the corresponding diagonal direction (i.e., unit cells 410 and 404 from FIG. 4, respectively). Therefore, dotted line 550*fc* represents a second set of inter-cell communicative coupling established between qubits in different sets of qubits in diagonally adjacent unit cells.

FIG. 4 was an example of a quantum processor architecture achieved by longitudinally shifting some of the qubits in each unit cell and tiling the unit cells across an area of the quantum processor. FIG. 5 shows qubit interconnections of quantum processor architecture 400 from FIG. 4 within each unit cell and in between unit cells. The present systems and devices is not limited to the quantum processor architecture shown in FIG. 4. Various different quantum processor architectures may be achieved by modifying a unit cell to enable interactions or communicative coupling between other unit cells and therefore the quantum processor architecture may be implemented in many different ways. For example, by varying the longitudinal shift, stagger or offset pattern of the qubits in a unit cell and by tiling the unit cells across an area of the quantum processor, many different quantum processor architectures may be achieved. The different architectures may be useful in solving different types of problems so that a certain problem that may be hard to solve using a certain quantum processor architecture may be easily solved by embedding the problem into a different architecture with qubit interactions that better suit the particular problem.

Figure 6:
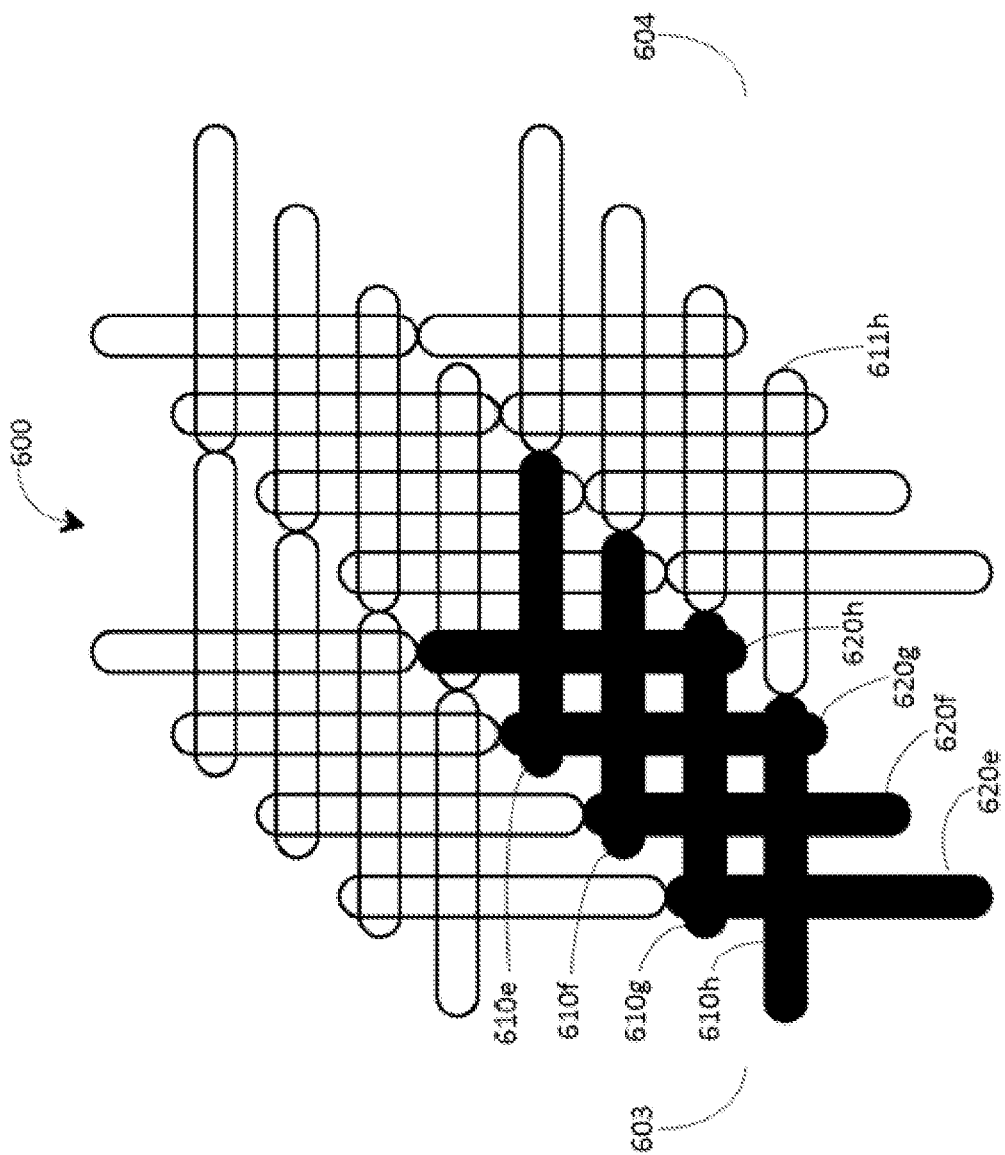
FIG. 6 is a schematic diagram of another quantum processor architecture that is based on a different unit cell configuration, in accordance with the present systems and devices.

FIG. 6 shows another quantum processor architecture 600 that is based on a different unit cell configuration, in accordance with the present systems and devices. Architecture 600 may be laid out into an integrated circuit. The integrated circuit may be multi-layered. There may be at least two layers of metal in the integrated circuit. Architecture 600 may comprise unit cell 603 which is filled-in to enhance clarity in FIG. 6. Only unit cells 603, 604 are called out in FIG. 6 to reduce clutter. Architecture 600 may be an alternative to architecture 400 of FIG. 4, achieved by changing the longitudinal shifting pattern of qubits in each unit cell.

Unit cell 603 includes qubits 610e-h which are laid out horizontally and arranged substantially parallel to each other and qubits 620e-h which are laid out vertically and arranged substantially parallel to each other and perpendicular to qubits 610e-h. Only horizontal qubit 611h of unit cell 604 is called out in FIG. 6 for further discussion. A person of skill in the art will appreciate that while eight qubits are illustrated in unit cell 603, this number is arbitrary and embodiments may comprise more or fewer than eight qubits.

The positioning of the qubits in each unit cell (e.g., unit cells 603, 604) of architecture 600 is different from the positioning of the qubits in each unit cell (e.g., unit cells 401, 402, 403, 404) of architecture 400. For example, each qubit 610f, 610g, 610h is longitudinally shifted, staggered or offset with respect to qubit 610e such that a respective transverse axes that passes through one respective end of each of qubits 610e, 610f, 610g, 610h may not pass through the corresponding end of any of the other qubits 610e, 610f, 610g, 610f. In other words, no ends of corresponding qubits 610e, 610f, 610g, 610h of unit cell 603 may be aligned. Architecture 600 may be a portion of a quantum processor comprised of a plurality of unit cells tiled over an area.

In the illustrative example of FIG. 6, the longitudinally shifted qubits are shifted, staggered or offset by an incremental shift of approximately 25% of their total length along their respective longitudinal axes in contrast to the qubits shifted, staggered or offset by approximately 50% of their total length as shown in FIG. 2. For example, qubit 610f is longitudinally shifted, staggered or offset with respect to qubit 610e by approximately 25% of its total length, qubit 610g is longitudinally shifted, staggered or offset with respect to qubit 610e by approximately 50% of its total length, and qubit 610h is longitudinally shifted, staggered or offset with respect to qubit 610e by approximately 75% of its total length. In other words, each of the longitudinally shifted, staggered or offset qubits in each unit cell of architecture 600 are longitudinally shifted, staggered or offset by different/incremental amounts that may enable different qubits to cross different number of other qubits in adjacent unit cells.

Each qubit 610e-h, 620e-h may be selectively communicatively coupled to at least one other qubit via respective coupling devices (not shown). An intra-cell coupling device may be positioned proximate a point where a qubit in the first set of qubits in a unit cell (e.g., qubits 610e-h) may cross a qubit in the second set of qubits in the same unit cell (e.g., qubits 620e-h). A first set of inter-cell coupling devices may be positioned between a respective pair of qubits in the same set of qubits in adjacent unit cells that cross one another. For example, a coupling device in a first set of inter-cell coupling devices is positioned proximate a point where horizontal qubits 610h of unit cell 603 and 611h of unit cell 604 are communicatively coupled together.

Qubits 610f, 610g, 610h may be shifted, staggered or offset longitudinally with respect to at least qubit 610e. Qubits 620e, 620f, 620g may be shifted, staggered or offset longitudinally with respect to at least qubit 620h. Alternatively, qubits 610e, 620h may be shifted, staggered or offset longitudinally. Which qubit is actually said to be "shifted longitudinally", staggered or offset with respect to the other qubit is arbitrary, and used in its relative sense. When a first qubit is shifted longitudinally with respect to a second qubit, it is to be understood that the second qubit may also considered to be shifted longitudinally with respect to the first qubit. Thus, shifted refers to the relative position of two qubits, the position of either one or both of the qubits equally capable of serving as a reference point with respect to which a shift of the other qubit is specified.

Longitudinally shifting, staggering or offsetting qubits and tiling unit cells (e.g., unit cells 603, 604) together over an area of the quantum processor as shown in architecture 600 may enable crossing between qubits in different unit cells. In a way similar to architecture 400, a second set of inter-cell coupling devices may be positioned proximate a point where a respective pair of qubits in different sets of qubits in adjacent unit cells cross one another. Coupling devices are not shown in FIG. 6 to reduce clutter. Although only architectures 400 and 600 are shown, many other architectures may be achieved in accordance with the present systems and devices by varying the qubit shift, stagger or offset pattern and therefore, the scope of the present systems and devices is not limited to architectures 400 and 600.

FIG. 7 shows a graph 700 illustrating the interconnections realized between the qubits in quantum processor architecture 600 from FIG. 6, in accordance with the present systems and devices. Graph 700 comprises subgraphs (e.g., subgraphs 703, 704) which represent unit cells of architecture 600 (e.g., unit cells 603, 604). For example, subgraph 703 includes vertices 710e, 710f, 710g, 710h which correspond to qubits 610e, 610f, 610g, 610h from unit cell 603 of FIG. 6. Subgraph 704 includes vertex 711h which corresponds to qubit 611h from unit cell 604 of FIG. 6. Only vertices 710e-h, 720e-h of subgraph 703 and vertex 711h of subgraph 704 are called out in FIG. 7 for further discussion.

Intra-cell selective communicative coupling which may be achieved by coupling qubits in different sets of qubits in the same unit cell is represented by thick solid lines. A first set of inter-cell selective communicative coupling which may be achieved by coupling qubits in the same set of qubits in adjacent unit cells is represented by thin solid lines and a second set of inter-cell selective communicative coupling which may be achieved by coupling qubits in different sets of qubits in adjacent unit cells are represented by dotted lines.

Similar to architecture 400 of FIG. 4, a qubit in architecture 600 may have a connectivity of six. However, the qubit configuration of each of the architectures 400, 600 is different from each other. For example, dotted line 550hh connecting vertices 520h and 511h in FIG. 5 which represents communicative coupling between qubits 420h and 411h in architecture 400 of FIG. 4 is not shown in FIG. 7 because corresponding qubits 620h, 611h in architecture 600 of FIG. 6 are not communicatively coupled to each other at all. The difference between graphs 500 and 700 may reflect variations of qubit interconnections or communicative coupling achieved by varying the longitudinal shifting, staggering or offsetting of qubits as shown in architectures 400 and 600. In accordance with the present systems and devices, the qubit interactions of each unit cell tiled across an area of a quantum processor may be varied by longitudinally shifting, staggering or offsetting qubits in each unit cell and such variations may produce quantum processor architectures that are advantageous for certain applications (e.g., for embedding a particular problem having a particular intrinsic interconnection).

Throughout this specification and the appended claims, the term "superconducting" when used to describe a physical structure such as a "loop of superconducting material" is used to indicate a material that is capable of behaving as a superconductor at an appropriate temperature. A superconducting material may not necessarily be acting as a superconductor at all times in all embodiments of the present systems and devices.

As described herein, each qubit may be positioned parallel to a respective longitudinal axis (e.g., longitudinal axes 240a, 240b of FIG. 2). The respective longitudinal axis of each qubit in a first set of qubits (e.g., qubit 410a of FIG. 4) may be parallel to the respective longitudinal axis of each of the other qubits in the first set of qubits (e.g., qubits 410b-h, 411e-h). Similarly, the respective longitudinal axis of each qubit in a second set of qubits (e.g., qubit 420a of FIG. 4) may be parallel to the respective longitudinal axis of each of the other qubits in the second set of qubits (e.g., qubits 420b-h, 421e-h). A first set of inter-cell coupling devices may include respective coupling devices positioned proximate a respective pair of qubits (e.g., region 450dh of FIG. 4) having parallel longitudinal axes in adjacent unit cells (e.g., qubits 420d, 420h) and may provide controllable communicative coupling between the respective pair of qubits having parallel longitudinal axes in adjacent unit cells. A second set of inter-cell coupling devices may include respective coupling devices positioned proximate a respective point (e.g., region 450hh of FIG. 4) where a respective pair of qubits (e.g., qubits 420h, 411h) in different sets of qubits in adjacent unit cells cross one another and may provide controllable communicative coupling between the respective pair of qubits in different sets of qubits in adjacent unit cells. Those of skill in the art will appreciate that the term "parallel" is used loosely in this specification and that any "parallel qubits" may be slightly off-parallel, for instance in accordance with typical manufacturing or fabrication tolerances.

Within a unit cell, the respective longitudinal axis (e.g., longitudinal axis 240a of FIG. 2) of each qubit in a first set of qubits (e.g., qubits 210a-d) may be perpendicular to the respective longitudinal axis (e.g., longitudinal axis 240b) of each qubit in a second set of qubits (e.g., qubits 220a-d) such that each qubit in the first set may perpendicularly cross at least one qubit in the second set. Further, a transverse axis of a qubit (e.g., transverse axis 260 of qubit 210b) may be perpendicular to the longitudinal axis of the same qubit (e.g., longitudinal axis 240a of qubit 210b). Those of skill in the art will appreciate that the terms "perpendicular", "perpendicularly" are used loosely in this specification and that, for example, the angle between the respective longitudinal axis of each qubit in a set of qubits and the respective longitudinal axis of each qubit in another set of qubits may be around but not exactly 90 degrees (i.e., slightly off-perpendicular).

The longitudinal axis of a qubit may be an axis that runs parallel to the qubit along the elongated direction of the qubit. The transverse axis of a qubit may be an axis that runs perpendicular, orthogonal, normal, and/or at 90 degrees to the longitudinal axis of the qubit. The elongated direction of a qubit may be the direction of the qubit that is parallel to the largest dimension spanned by the qubit (i.e., length, where the length of the qubit may be larger than the height and the width of the elongated qubit).

Throughout this specification and the illustrated embodiments, the qubits are generally represented as elongated essentially straight loops. However, those of skill in the art will appreciate that the qubits may not always be straight and can be essentially curvy such as elongated serpentine loops. A curvy or serpentine loop may, for example, be elongated along a direction that is parallel to a longitudinal axis, and thus the respective longitudinal axes of multiple curvy or serpentine loops may be parallel to one another at any given point there along. In this context, the term parallel is used in the sense that the two loops will never cross.

At least one qubit (e.g., qubits 210b, 210d of FIG. 2) in a set of qubits in each unit cell (e.g., unit cell 200) is longitudinally shifted, staggered or offset with respect to at least one other qubit (e.g., qubits 210a, 210c) in the same set of qubits. The terms "shifted" or "staggered" is used to suggest at least one qubit moved, offset, placed or positioned with respect to another qubit along the respective longitudinal axis of the qubit such that the ends of a shifted qubit are not aligned with the ends of an unshifted qubit. In other words, a qubit may be shifted, staggered or offset such that a transverse axis of the qubit, perpendicular to the longitudinal axis of the qubit, that passes through one end of the qubit (e.g., end 245b of qubit 210b) does not pass through the same end of another qubit (e.g., end 245a of qubit 210a) in the same set of qubits. For example, in FIG. 2, qubit 210b is longitudinally shifted or staggered or offset with respect to at least qubit 210a such that transverse axis 260 of qubit 210b, perpendicular to longitudinal axis 240a of qubit 210b, that passes through end 245b of qubit 210b, passes through an approximate midpoint between the ends of qubit 210a.

Shifting, staggering or offsetting qubits longitudinally and tiling unit cells of shifted qubits adjacent to one another may enable at least one qubit in each respective unit cell to cross at least one qubit in an adjacent unit cell thereby enabling additional inter-cell interaction or controllable communicative coupling. For example, longitudinally shifted qubit 411h in one unit cell (i.e., unit cell 404) in FIG. 4 crosses qubit 420h in another unit cell (i.e., unit cell 403) at approximately region 450hh where qubit 411h and 420h are in different sets of qubits. Unit cells 403 and 404 are horizontally adjacent where shifting qubit 411h results in qubit 420h of unit cell 403 crossing qubit 411h of unit cell 404 thereby enabling inter-cell interaction or communicative coupling. Throughout this specification and the appended claims, references to communicative coupling may generally be implemented via a coupling device positioned proximate a respective pair of qubits being coupled.

A qubit in a first set may cross a qubit in a second set of the same or an adjacent unit cell by overlying/underlying at least a portion of the qubit in the second set. Which one is actually said to "cross" the other is arbitrary, and used in a relative sense. When a first qubit crosses a second qubit, it is to be understood that the second qubit may also be considered to cross the first qubit. A qubit in a first set may cross a qubit in a second set of the same or an adjacent unit cell where a portion of the qubit in the in the first set overlaps a portion of the qubit in the second set, for instance as projected from one plane or layer of a die to another plane or layer of the die in an orthogonal direction. For example, qubit 420a of FIG. 4 overlaps qubit 410d at approximately region 450da. Since both qubits 420a and 410d are in the same unit cell (i.e., unit cell 401), an intra-cell coupling device is placed at region 450da to communicatively couple qubits 420a and 410d together.

A first set of inter-cell coupling devices may be positioned between a pair of qubits in the same set of qubits in adjacent unit cells and may provide controllable communicative coupling between the respective pair of qubits in the same set of qubits in adjacent unit cells. A second set of inter-cell coupling devices may be positioned proximate a point where a qubit in a first set of qubits in one unit cell crosses a qubit in a second set of qubits in an adjacent unit cell and may provide controllable communicative coupling between qubits in different sets of qubits in adjacent unit cells. Throughout the specification and the appended claims, the word "proximate" is used to describe the position of a coupling device. In this context, the term "proximate" is intended to mean "sufficiently proximate so as to communicatively couple to" the respective qubits between which the coupling device provides communicative coupling. A coupling device may be positioned in a region where two qubits may be communicatively coupled together such that the coupling device may provide antiferromagnetic, ferromagnetic, zero or transverse coupling between the qubits. For example, the coupling device which may communicatively couple qubits 420h and 411h together may be positioned/placed in an approximate region 450hh. However, region 450hh is an illustration only and the actual coupling device that communicatively couples qubits 420h and 411h together may or may not extend out of region 450hh. Furthermore, the word "adjacent" when used in the context of the present systems and devices, is generally intended to mean "proximally adjacent" or "alongside" in the sense that adjacent unit cells or components thereof may not be in physical contact with one another.

It should be noted that many other architectures such as architectures 400, 600 may be created by varying the longitudinal shifting, staggering or offsetting of qubits. As such, the invention is not restricted to the illustrative quantum processor architectures presented in the present specification and figures.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other analog processors, not necessarily the exemplary quantum processors generally described above.

The various embodiments described above can be combined to provide further embodiments. To the extent that they are not inconsistent with the specific teachings and definitions herein, all of the U.S. patents, U.S. patent application publications, U.S. patent applications, referred to in this specification and/or listed in the Application Data Sheet, including but not limited to U.S. provisional patent application Ser. No. 61/711,647 filed Oct. 9, 2012, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A quantum processor comprising:
a plurality of unit cells tiled over an area such that each unit cell is positioned proximally adjacent at least one other unit cell, each unit cell comprising:
  a first set of qubits and a second set of qubits, wherein a portion of each qubit in the first set of qubits crosses a portion of at least one qubit in the second set of qubits; and
  a set of intra-cell coupling devices, wherein each intra-cell coupling device is positioned proximate a respective point where one of the qubits in the first set of qubits crosses one of the qubits in the second set of qubits and provides controllable communicative coupling between the one of the qubits in the first set of qubits and the one of the qubits in the second set of qubits;
wherein a portion of at least one qubit in the first set of qubits in each unit cell crosses a portion of at least one qubit in the second set of qubits in at least one proximally adjacent unit cell, and wherein the quantum processor further comprises:
a first set of inter-cell coupling devices, wherein each inter-cell coupling device in the first set of inter-cell coupling devices provides controllable communicative coupling between either a respective pair of qubits each in a respective first set of qubits in a respective one of a pair of proximally adjacent unit cells or a respective pair of qubits each in a respective second set of qubits in a respective one of a pair of proximally adjacent unit cells; and
a second set of inter-cell coupling devices, wherein each inter-cell coupling device in the second set of inter-cell coupling devices is proximate a respective point where a respective pair of qubits in proximally adjacent unit cells cross one another and provides controllable communicative coupling between the respective pair of qubits in proximally adjacent unit cells that cross one another.

2. The quantum processor of claim 1 wherein the quantum processor comprises a multi-layered integrated circuit.

3. The quantum processor of claim 2 wherein the quantum processor comprises a superconducting quantum processor and the multi-layered integrated circuit comprises a multi-layered superconducting integrated circuit.

4. The quantum processor of claim 3 wherein each qubit comprises a loop of superconducting material interrupted by at least one Josephson junction.

5. The quantum processor of claim 4 wherein each coupling device comprises a loop of superconducting material interrupted by at least one Josephson junction.

6. The quantum processor of claim 4 wherein, in each unit cell:
each loop of superconducting material is elongated along a respective longitudinal axis, and wherein the respective longitudinal axis of each qubit in the first set of qubits is parallel to the respective longitudinal axis of each of the other qubits in the first set of qubits and the respective longitudinal axis of each qubit in the second set of qubits is parallel to the respective longitudinal axis of each of the other qubits in the second set of qubits.

7. The quantum processor of claim 6 wherein, in each unit cell:
the respective longitudinal axis of each qubit in the first set of qubits is perpendicular to the respective longitudinal axis of each qubit in the second set of qubits such that a portion of each qubit in the first set of qubits perpendicularly crosses a portion of at least one qubit in the second set of qubits.

8. The quantum processor of claim 1 wherein, in each unit cell:
the first set of qubits includes at least four qubits and the second set of qubits includes at least four qubits, such that each unit cell includes at least eight qubits.

9. The quantum processor of claim 1 wherein each unit cell is positioned horizontally proximally adjacent, vertically proximally adjacent, or diagonally proximally adjacent at least one other unit cell.

10. The quantum processor of claim 9 wherein each unit cell is positioned proximally adjacent at least three other unit cells such that each unit cell is positioned horizontally proximally adjacent at least one other unit cell, vertically proximally adjacent at least one other cell, and diagonally proximally adjacent at least one other cell.

11. The quantum processor of claim 1 wherein, in each unit cell:
at least a portion of each qubit in the first set of qubits is carried in a first layer and at least a portion of each qubit in the second set of qubits is carried in a second layer, such that at each respective point where one of the qubits in the first set of qubits crosses one of the qubits in the second set of qubits, the one of the qubits in the first set of qubits is in the first layer and the one of the qubits in the second set of qubits is in the second layer, the second layer different from the first layer.

12. The quantum processor of claim 11 wherein, in each unit cell:
at least a portion of each intra-cell coupling device and/or at least a portion of each inter-cell coupling device from the first set of inter-cell coupling devices and/or at least a portion of each inter-cell coupling device from the second set of inter-cell coupling devices is carried in the second layer.

13. The quantum processor of claim 11 wherein, in each unit cell:
at least a portion of each intra-cell coupling device and/or at least a portion of each inter-cell coupling device from the first set of inter-cell coupling devices and/or at least a portion of each inter-cell coupling device from the second set of inter-cell coupling devices is carried in a third layer.

14. The quantum processor of claim 11 wherein, in each unit cell:
at least a portion of each qubit in the first set of qubits is carried in the second layer and/or at least a portion of each qubit in the second set of qubits is carried in the first layer.

15. A quantum processor comprising:
a plurality of unit cells tiled over an area such that each unit cell is positioned proximally adjacent at least one other unit cell, each unit cell comprising:
a plurality of qubits, wherein each qubit in the plurality of qubits respectively comprises:
a loop of superconducting material that is elongated along a longitudinal axis; and
a first end where the loop crosses the longitudinal axis;
wherein the plurality of qubits includes a first set of qubits and a second set of qubits, the qubits in the second set being different from the qubits in the first set, the respective longitudinal axes of the qubits in the first set parallel to a first direction and the respective longitudinal axes of the qubits in the second set parallel to a second direction, the first direction and the second direction being at a non-zero angle to one another, a portion of each qubit in the first set of qubits crosses a portion of at least one qubit in the second set of qubits, and wherein at least one qubit in the first set of qubits is longitudinally shifted with respect to at least one other qubit in the first set of qubits such that a transverse axis of the at least one longitudinally-shifted qubit, perpendicular to the longitudinal axis of the at least one longitudinally-shifted qubit, that passes through the first end of the at least one longitudinally-shifted qubit does not pass through the first end of the at least one other qubit in the first set of qubits; and
a set of intra-cell coupling devices, wherein each intra-cell coupling device is positioned proximate a respective point where one of the qubits in the first set of qubits crosses one of the qubits in the second set of qubits and provides controllable communicative coupling between the one of the qubits in the first set of qubits and the one of the qubits in the second set of qubits;
wherein a portion of the at least one longitudinally-shifted qubit in the first set of qubits in each unit cell crosses a portion of at least one qubit in the second set of qubits in at least one proximally adjacent unit cell, and wherein the quantum processor further comprises:
a plurality of inter-cell coupling devices, the plurality of inter-cell coupling devices including:
a first set of inter-cell coupling devices, wherein each inter-cell coupling device in the first set of inter-cell coupling devices provides controllable communicative coupling between a respective pair of qubits having parallel longitudinal axes in proximally adjacent unit cells; and
a second set of inter-cell coupling devices, wherein each inter-cell coupling device in the second set of inter-cell coupling devices is positioned proximate a respective point where the at least one longitudinally-shifted qubit in the first set of qubits in each unit cell crosses one of the qubits in the second set of qubits in a proximally adjacent unit cell and provides controllable communicative coupling between the at least one longitudinally-shifted qubit in the first set of qubits and the one of the qubits in the second set of qubits in the proximally adjacent unit cell.

16. The quantum processor of claim 15 wherein, in each unit cell:
the non-zero angle between the first direction and the second direction is about ninety degrees such that the respective longitudinal axes of the qubits in the first set of qubits is perpendicular to the respective longitudinal axes of the qubits in the second set of qubits.

17. The quantum processor of claim 15 wherein the respective superconducting loop of each qubit is interrupted by at least one respective Josephson junction.

18. The quantum processor of claim 15 wherein each coupling device comprises a respective loop of superconducting material interrupted by at least one Josephson junction.

19. The quantum processor of claim 15 wherein a portion of at least one qubit in at least one unit cell crosses both a portion of at least one qubit in a first proximally adjacent unit cell and a portion of at least one qubit in a second proximally adjacent unit cell.

20. The quantum processor of claim 15 wherein the quantum processor comprises a multi-layered superconducting integrated circuit, and wherein, in each unit cell:
at least a portion of each qubit in the first set of qubits is carried in a first layer and at least a portion of each qubit in the second set of qubits is carried in a second layer, such that at each respective point where one of the qubits in the first set of qubits crosses one of the qubits in the second set of qubits, the one of the qubits in the first set of qubits is in the first layer and the one of the qubits in the second set of qubits is in the second layer, the second layer different from the first layer.

21. The quantum processor of claim 20 wherein, in each unit cell:
at least a portion of each intra-cell coupling device and/or at least a portion of each inter-cell coupling device from the first set of inter-cell coupling devices and/or at least a portion of each inter-cell coupling device from the second set of inter-cell coupling devices is carried in the second layer.

22. The quantum processor of claim 21 wherein, in each unit cell:
  at least a portion of each intra-cell coupling device and/or at least a portion of each inter-cell coupling device from the first set of inter-cell coupling devices and/or at least a portion of each inter-cell coupling device from the second set of inter-cell coupling devices is carried in a third layer.

23. The quantum processor of claim 21 wherein, in each unit cell:
  at least a portion of each qubit in the first set of qubits is carried in the second layer and/or at least a portion of each qubit in the second set of qubits is carried in the first layer.

24. The quantum processor of claim 15 wherein each unit cell is positioned horizontally proximally adjacent, vertically proximally adjacent, or diagonally proximally adjacent at least one other unit cell.

25. The quantum processor of claim 24 wherein each unit cell is positioned proximally adjacent at least three other unit cells such that each unit cell is positioned horizontally proximally adjacent at least one other unit cell, vertically proximally adjacent at least one other cell, and diagonally proximally adjacent at least one other unit cell.

26. The quantum processor of claim 15 wherein at least one pair of qubits having parallel longitudinal axes in proximally adjacent unit cells comprises a first qubit and a second qubit, the first qubit being in the first set of qubits in a first unit cell and the second qubit being in the first set of qubits in a second unit cell, wherein the second unit cell is proximally adjacent the first unit cell.

27. The quantum processor of claim 15 wherein, in each unit cell:
  the first set of qubits includes at least four qubits and the second set of qubits includes at least four qubits, such that each unit cell includes at least eight qubits.

28. The quantum processor of claim 15 wherein each qubit in the plurality of qubits further comprises:
  a second end where the loop crosses the longitudinal axis, the second end distal to the first end; and
  a midpoint positioned on the longitudinal axis at least approximately halfway between the first end and the second end; and
  the at least one longitudinally-shifted qubit in the first set of qubits is longitudinally shifted with respect to the at least one other qubit in the first set of qubits such that the transverse axis of the at least one longitudinally-shifted qubit that passes through the first end of the at least one longitudinally-shifted qubit passes through the midpoint of the at least one other qubit.

* * * * *